(12) United States Patent
McQueen et al.

(10) Patent No.: US 6,628,202 B2
(45) Date of Patent: *Sep. 30, 2003

(54) THERMAL DISPERSION MASS FLOW RATE AND LIQUID LEVEL SWITCH/TRANSMITTER

(75) Inventors: Malcolm M. McQueen, Encinitas, CA (US); Samuel Kresch, Encinitas, CA (US); Agustin J. Rodriguez, Escondido, CA (US)

(73) Assignee: Fluid Components Intl, San Marcos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/100,477

(22) Filed: Mar. 14, 2002

(65) Prior Publication Data

US 2002/0130780 A1 Sep. 19, 2002

Related U.S. Application Data

(63) Continuation-in-part of application No. 09/396,069, filed on Sep. 15, 1999, now Pat. No. 6,208,254.

(30) Foreign Application Priority Data

Sep. 15, 2000 (US) ................................ PCT/US00/25480

(51) Int. Cl.$^7$ ............................................... G08B 21/00
(52) U.S. Cl. ..................... 340/603; 340/606; 73/861; 73/202.5; 73/204.17; 73/204.23; 73/204.25; 73/204.27
(58) Field of Search ................................ 340/603, 606; 73/861, 861.01, 202.5, 204.17, 204.23, 204.25, 204.27

(56) References Cited

U.S. PATENT DOCUMENTS

| | | |
|---|---|---|
| 3,366,942 A | 1/1968 | Deane |
| 4,255,968 A | 3/1981 | Harpster |

(List continued on next page.)

FOREIGN PATENT DOCUMENTS

| | | |
|---|---|---|
| DE | 30 06 584 | 9/1981 |
| DE | 88 16 063 | 5/1989 |
| DE | 196 40 772 | 4/1997 |
| GB | 2138566 | 10/1984 |

OTHER PUBLICATIONS

Website: www.aoc.cooler.com/peltier–effect.htm—"Frequently asked questions about Peltier Effect". Alpha & Omega Computer, Inc.

(List continued on next page.)

*Primary Examiner*—Julie Lieu
(74) *Attorney, Agent, or Firm*—The Maxham Firm

(57) ABSTRACT

A thermal dispersion switch/transmitter for determining flow rate and liquid level in a non-contacting apparatus. A special preparation of one or more small spots in the outside surface of the wall of the conduit, standpipe or container enables one or more thermally sensitive elements to reside very close to the fluid on the opposite side of the wall. A temperature sensor is formed of a raster pattern electrical conductor deposited on a thin, electrically insulative, thermally conductive flat chip. One temperature sensor is time-shared and is periodically self heated and functions as the reference as well as the active or heated sensor of the invention. One alternative is to employ two temperature sensors, one being a reference sensor and the other being the active sensor. An alternative embodiment employs the same construction of one or more small, very thin membrane surfaces to which multiple detectors are mounted inside a probe inserted into the conduit. A second alternative embodiment employs the same construction of a very thin, small area spot on the outside of a probe inserted into a conduit or vessel for flow rate, liquid level, or interface sensing. Other embodiments are shown and described. All of the embodiments employ a miniature temperature sensor with the sensing element being self heated, the switch/transmitter being configured to operate at intrinsically safe, 24 VDC, 4–20 mA input power.

11 Claims, 8 Drawing Sheets

U.S. PATENT DOCUMENTS

| | | |
|---|---|---|
| 4,519,246 A | 5/1985 | Hartemink |
| 4,616,505 A | 10/1986 | Jouwsma |
| 4,735,086 A | 4/1988 | Follmer |
| 4,899,584 A | 2/1990 | McQueen |
| 4,967,593 A | 11/1990 | McQueen |
| 4,977,385 A | 12/1990 | McQueen |
| 5,111,692 A | 5/1992 | McQueen et al. |
| 5,117,216 A | 5/1992 | McQueen |
| 5,152,049 A | 10/1992 | McQueen |
| 5,167,153 A | 12/1992 | McQueen |
| 5,201,223 A | 4/1993 | McQueen |
| 5,221,916 A | 6/1993 | McQueen |
| 5,233,868 A | 8/1993 | Coats et al. |
| 5,237,867 A | 8/1993 | Cook, Jr. |
| 5,355,727 A | 10/1994 | McQueen |
| 5,392,647 A | 2/1995 | Manaka |
| 5,398,549 A | 3/1995 | Suzuki |
| 5,410,912 A | 5/1995 | Suzuki |
| 5,428,994 A | 7/1995 | Wenzel et al. |
| 5,600,528 A | 2/1997 | McQueen |
| 5,703,288 A | 12/1997 | Horiguchi et al. |
| 5,780,737 A | 7/1998 | Wible et al. |
| 6,208,254 B1 | 3/2001 | McQueen et al. |

OTHER PUBLICATIONS

Website:www.schottky.ucsd.edu/~felix/peltier.html—"An intuitive introduction to three effects in thermoelctricity". Alpha & Omega Computer, Inc.

Advanced Pressure Technology, "Series AP7300 Flow Switch," Trade literature, 4 pp. (1981).

Intek, Inc., "The Ultimate Flow Meter For Low Flow Measurement," Trade literature, 4 pp. (1995).

Nupro Company, "FV4 Series Vertical Flow Sensor," Trade literature, 4 pp. (1988).

Advanced Pressure Technology, "Series AP74 Vertical Flow Switch" Trade literature, 4 pp. (1997).

THERMAL DISPERSION MASS FLOW RATE AND LIQUID LEVEL SWITCH/TRANSMITTER

This is a continuation-in-part of application Ser. No. 09/396,069, filed Sep. 15, 1999, now U.S. Pat. No. 6,208,254, issued Mar. 27, 2001.

BACKGROUND

1. Field of the Invention

This invention relates generally to thermal dispersion sensors and more particularly to such sensors employing thermally sensitive detection elements mounted externally to the fluid container or conduit to sense liquid level therein or mass flow rate therethrough. Alternatively, an insertion device can also be employed wherein the detectors are inside the vessel but, because of various sealing mechanisms, are still topologically outside the container and isolated from the media.

2. Discussion of the Related Art

In many industrial and commercial fields there is a requirement for compact and versatile flow rate detectors which positively determine that a particular mass of fluid is flowing, has stopped flowing, is flowing above or below a predetermined threshold mass velocity level or the actual mass flow rate at which it is flowing. Alternatively, such a device may be used to determine when the level of rising or falling liquid in a container has reached a predetermined height. The conduits and containers involved may be oriented vertically, horizontally, or they may be inclined, and can range in size from fractions of an inch to as much as several feet in diameter. Returning to the mass flow rate sensing application, this requirement is particularly strong in manufacturing situations where it is critical that the amount and velocity of flowing gas must be known. This is even more critical where those gases are toxic, which often occurs in the manufacture of electronic chips.

Fabrication methods incidental to the mechanical operating principles of current devices used in the electronic chip industry often result in dead-end cavities, labyrinthian passageways, irregular and rough surfaces from welding, close diametral clearances between moving parts. The impossibility of purging and other effects from the labyrinthian passages are also detrimental to delivering clean gas. In many instances, the absence of polished surfaces, the presence of close fitting parts and dead-end cavities can all but prevent the delivery of pure products or the purging of the system when gaseous products are changed. Moreover, current devices used in chip manufacturing typically employ moving parts. Inevitably, particle matter generated by the moving parts further contaminate the gaseous media being employed. Ultra cleanliness and purity are absolutely necessary if high quality electronic chips are to be manufactured. In many instances, smooth finishes and the ability to effectively clean the conduit can be all but impossible to achieve with some devices currently on the market. Failure to note that flow has ceased or has been reduced below or increased above certain predetermined flow velocity thresholds in a conduit may be very costly and in some instances could be catastrophic. The same can be true of liquid levels. As processes increase in speed and output, and precision becomes ever more of a requirement, often resulting from advances in technology, such failures tend to be ever more costly and dangerous.

Devices have long been available for detecting and, in some cases, measuring the rate of flow of fluids or liquid level. A common type of flow detector utilizes the force exerted by the moving fluid against a paddle or movable wall immersed in the fluid or the fluid flow to indicate or determine the rate of fluid motion. Regardless of the form chosen for the immersed object, for example, propeller, vane, piston, deflection arm, drogue or the like, all of these devices are subject to a number of potentially serious shortcomings for certain uses, especially for mass flow rate measurements as required in chip manufacturing and most other applications. All of the above require compensation for pressure and temperature and the effects these variables have on density of gaseous media. Moveable parts tend to deteriorate after continued immersion for extended periods of time and can become corroded or frozen in place after even brief contact with many fluids. This is especially true with gases or liquids which may be toxic, corrosive, or both. Seals and packing, always at least minor problems, become monumental tasks when moving parts are involved. Mechanical deformation and fatigue induced breakdowns also plague this class of indicators. When these mechanical devices are used, they are, by and large, wholly unsuitable for chip manufacturing purposes as well as many other exacting purposes. They are also generally unsuitable for the detection of flow stoppage, reduction in flow velocity below a predetermined level, or changes in fluid level in customary commercial and industrial applications. This subject will be further discussed below.

Because of the disadvantages of requiring the force exerted by the moving fluid against some object in order to provide detectable motion or level changes, thermal dispersion mass flow meters have become a common choice for flow metering devices in the commercial and industrial metering and level sensing markets. A typical flow sensor element for use in such meters is the resistance temperature detector (RTD), the resistance of which is related to the temperature of the element itself. Although RTDs are the preferred device, many other types of small heatable temperature detector/heaters could also be considered. Thermocouples, thermistors, temperature sensitive diodes and other transistors or solid state devices could be used. Also RTDs come in many forms such as chips, wire wound elements and grids. A typical flow rate or level sensor employs at least two RTD elements. One of them is referred to as a reference element and is normally unheated. The active RTD element is heated and the temperature reduction effect of mass flow or wetting on the heated element provides a measure of the mass flow velocity or a phase change from dry to wet of the substance in the conduit or vessel being monitored. The density of a gaseous fluid flowing across the active RTD is also a directly proportional factor in the amount of heat dissipated from the RTD. As discussed above, RTD sensors can also be employed for liquid level detection and interface detection of gas to liquid, and non-miscible liquids such as oil/water, clear water and sludge or slurries, to name a few.

There are many configurations of dispersion mass flow sensors, and more particularly, of heated RTD type sensors. An early such flow detector is found in U.S. Pat. No. 3,366,942. This patent discloses a reference sensor, a heated or active sensor, and a separate heating element located closely adjacent the heated sensor element. The basic principle of operation of dispersion flow meters is well known and is discussed in this patent. A different configuration of a three-element thermal dispersion sensor is shown in U.S. Pat. No. 4,899,584. There any many other examples of detectors employing differential temperature sensors, some having three elements as described in the patents mentioned above, and some having two elements, where the active sensor has the heater integral therewith and is self heated. Even a single element differential temperature sensor may be employed. The single element sensor works on a time sharing basis where it acts as a reference sensor part of the time and is then heated to act as the active sensor, switching alternately in relatively rapid succession. Another example of a differential temperature sensor is shown in U.S. Pat. No. 5,780,737.

The devices shown in the patents mentioned above have no moving parts and have proven satisfactory, at least in many circumstances where it is desirable to determine that fluid flow has stopped. They are also very sensitive to low levels of mass flow of fluid. It is important to note that in the examples above and in many other related examples, the RTD type sensors are mounted in a thermal well and are immersed in the fluid flowing in a conduit, or are positioned to be wetted by liquid at predetermined levels.

For the manufacture of electronic chips, where toxic gases are employed, immersion sensors of any type are generally not appropriate because of the intrusion of the expensive thermal wells into the relatively small conduit containing the flowing stream. Such devices typically are too large for the conduits involved in electronic chip manufacture and likely cannot be properly purged of possible residual gases from previous uses.

For example, in electronic chip manufacturing, noxious and often toxic gasses are used in vapor deposition. In order to control the flow of those vapors and to ensure that excess vapors do not overload the system's capacity to properly contain them, an excess flow sensor and switch can be used. Examples of prior art devices which can be employed for such purposes are flow rate magnet/reed switches. Magnetic switches of this type are sold by Nupro Company under the designation "FV4 Series Vertical Flow Sensor," and the series "AP74 Vertical Flow Switch" is sold by Advanced Pressure Technology, specifically for use in the manufacture of electronic chips. An actual switch is required, which is external to the conduit through which the gases flow, and a moving magnet is positioned within the fluid conduit. Thus these devices are partially direct contact and partially remote sensor devices. These mechanical switches are not well suited for mass flow rate sensing because they are sensitive to volume flow rate and mass flow rate errors are introduced because of density variables. Principally, pressure is the primary cause of such density variables. For these types of switches, several different models would be required to satisfy the various trip points that might be specified by any user. The trip point of choice is fixed and set in the factory and is not accurate as explained in their specifications.

Temperature can also affect density and is a contributing error factor in some cases. Trade literature for such magnetic switch products show that the trip point flow rate is a function of pressure. One model will trip at 15 SLPM (standard liters per minute) when the system is pressurized to 100 psig. If this model were placed in a 20 psig system, it would trip at 7 SLPM. That is more than a 100% difference from a trip point of 15 SLPM. Thus the requirement of many different models for different flow rates and density uses. Ideally, the customer would prefer to have a single switch with a trip point of, for example, 10 SLPM, which would trip at that value over any pressure range between 0 and 100 psig. Also, these magnetic switches have a wide hysteresis where the trip point has a very different value than the reset point of a particular switch.

Not only is it all but impossible to achieve appropriate cleaning and smooth finishes, but welding, purging and other effects from the labyrinthian passages of the magnetic sensors discussed above can be detrimental to the delivery of clean gas. Additionally, the moving magnet and its enclosure in the flowing media may also generate foreign particles which could contaminate the electronic chips being manufactured.

There are some external or conduit surface mounted temperature detectors previously available. An example is the series AP7300 Flow Switch by Advanced Pressure Technology and the Rheotherm Flow Instruments of Intek, Inc. These are indeed external surface mounted devices but there is no indication of the existence of a local, small, specially prepared surface to increase the sensitivity of the sensing element, at low power levels, to the rate of flow of the fluid within the conduit to which they are attached. Additionally, a separate heater is employed and miniaturization by use of a chip type RTD is not shown. Another example is the use of wire RTDs wrapped around small and medium size tubes as the sensor element. Such a sensor would be relatively large in area and require high power for heating. If the conduit is thinned on its periphery to bring the wire wound RTD closer to the flowing medium, it would compromise the mechanical strength of the tube. Power requirements can be relatively high and sensitivity may be insufficient for detecting small flow rate changes, especially when the mass flow rate is low.

It is readily understood that whenever the substance being measured is in direct contact with the measuring instrument, the measuring instrument will have some effect upon the substance being measured. Thus, there is a need for a sensitive detector for liquid level or fluid flow to accurately and sensitively measure fluid flow or level without directly affecting or being in direct contact with the fluid being measured. A general purpose industrial thermal flow switch employing thermal wells, such as the Model FLT-93S manufactured and sold by Fluid Components Intl, is generally inappropriate for the particular application (electronic chip manufacturing) to which one example of the present invention is most specifically directed. Further, such devices are inappropriate for most other purposes of the invention described below because they have relatively large heaters and consequently require relatively high operating power. Additionally, those devices do not employ laminar boundary layer flow sensing.

SUMMARY OF THE INVENTION

This invention relates generally to an extremely sensitive, self heated, miniaturized, low power, rugged, chip-type resistance temperature detector (RTD) and a special mounting therefor on the fluid flow conduit wall, or inserted into a vessel, but external to the flow path in that conduit or the media in the vessel. Since the invention can be employed to sense mass flow in a conduit or liquid level in a container or stand pipe, whenever either term "conduit" or "container" is used herein, it should be understood to include the other term as appropriate.

The invention in the preferred form employs a chip RTD designed as a temperature sensor, which is mounted with its flat side against a specially created flat surfaced, thin walled small receptacle in the exterior of the fluid conduit or container. The chip may be self heated to deliberately cause it to sense a higher temperature than it would if used in its usual capacity as a temperature sensor. The conduit is formed with a thin, local small flat area which receives the chip RTD in close proximity but not actually in the flowing fluid. The thin-walled small flat area or detent formed in the external surface of the fluid conduit is configured so that the heat generated in the heated chip will flow principally and immediately to and be carried away by the media, that is, to the fluid, rather than axially or circumferentially along the conduit or container wall. The small size and high resistance of the chip RTD permits operation at a high chip temperature and at low power and low current to accommodate the modest power available from an intrinsically safe 4–20 mA single wire loop and without grossly compromising the structural integrity of the vessel or duct by requiring a large local thin area that likely would be needed for ordinary contemporary high-power-consuming larger devices as discussed previously.

The instrument industry has developed a standard practice of operating sensors with a low voltage (less than 24 VDC) and a low current in the range of 4–20 mA over a two-wire loop powered system in order to make them intrinsically safe. "Intrinsically safe" means, in effect, that a short circuit spark from any postulated failure will not set off an explosion when that spark occurs in an explosive atmosphere. No other thermally activated flow rate, interface or liquid level sensor is known which can operate under these low power, intrinsically safe conditions.

The configuration of the invention permits operation without a bulky transformer when 110 volt or higher AC voltage is the only available source of power. At these lower power needs, a simple dropping resistor can serve to reduce the voltage without excessive heating. High voltage DC can also be easily accommodated by also using a dropping resistor. The combination of small size, self heating, and high resistance of the heated sensor, and the mounting preparation of the conduit or container wall improve on previously known methods to the point where the extremely accurate sensor of this invention can operate on the 4–20 mA loop or from a small, economical power supply where no other power is available. Moreover, because the device senses boundary layer flow, it can easily accommodate higher flow rate ranges than can be accommodated by, for example, small insertion-type sensors immersed in turbulent flow fields and conditions in the usual thermal well. This concept can be applied to thermal well sensors of the type of model FLT-93S (sold by Fluid Components Intl) but that is not the preferred form.

In this particular configuration, a thin wall of pipe is left after a flat surface is prepared to mount the flat side of the chip RTD in the most intimate contact possible with the media, forming a non-intrusive flow sensor in the preferred version. But the same methods can be employed with equally favorable result with an insertion device. Even though it projects into the fluid flow path, the insertion device is topologically equal to the preferred mechanism where the RTD chip is outside the vessel and with sufficient flat area exposed to the flow field so that boundary layer flow occurs locally on the flat surface of the insertion instrument.

The invention also contemplates a method for making and using the sensor/conduit wall combination, the use of a single chip RTD which ultimately acts as the reference sensor and the heated sensor in a time sharing arrangement, and possibly using several such chip RTD sensors around a larger pipe to compensate for flow stratification, or on a vertically oriented still well at various vertical positions for level gauging. The term "larger diameter pipes" could be applied to pipes ranging from about one inch in diameter to any practical size.

One or more sensors could be used to detect both flow rate and phase change where, for example, a horizontal liquid-handling pipe leads to a pump inlet. The device can sense the liquid flow and, should gas appear, the instrument can signal the presence of gas as well as liquid flow rates. In the last example, three RTDs might be employed wherein two RTDs are heated and one RTD would be used for a reference sensor. One heated RTD would be mounted on the top of the horizontal-flow inlet pipe to signal wet/dry and the second heated RTD would be located where it would sense a wet and flowing condition.

As referred to above, customary industrial and commercial application are other important uses of the invention. In many applications where mechanical floats or immersed paddles have been unsuccessfully employed, the subject of this invention can easily be substituted for the failure prone mechanically actuated switches wherein two wires are already available for the conversion to a 4–20 mA-loop-powered thermal flow switch.

Owing to the small size of the chip-type RTD, and partially from the self-heating of the heated RTD and the preparation of the thin-walled mounting surface, very low levels of heater power may be exclusively employed in order to generate a sufficiently high differential temperature between the heated RTD and its companion "reference" RTD.

The two wires already installed to signal contact position of the prior mechanically actuated switches can be employed in the present invention in the case of a retrofit. Customarily and widely used in industrial instrumentation is a two wire loop carrying from 4 to 20 milliamperes. This power supply can be attached to one end of the two wires already available and the electronics and sensing RTDs can be attached to the wires at the opposite end where the mechanical switches had been located.

To the exclusion of other similar thermal switches that consume much higher power levels, 10 milliamperes of the loop power or less could be employed to operate the electronics and heat the heated sensor. The remaining 10 milliamperes can be variably consumed or "sunk" to convey a signal of varying flow rate. Alternatively, a wet/dry condition could be signaled by monitoring the current in the loop. For example, 10 milliamperes could signal a "dry" condition and when the RTDs are wetted, an additional five or ten milliamperes could be drawn (or sunk) to signal a phase change from "dry" to "wet."

Thus, by the teaching of this invention, it is possible to exclusively adapt thermal switches or even flow rate transmitters to the 4 to 20 mA signal/power used for modern industrial instrumentation practice. This is the case for new installations as well as retrofitting inefficient or inoperative mechanical installations wherein two suitable wires are already in place, without the need for new and expensive wiring or the necessity to undergo a weight penalty in aerospace installations. The rule of thumb is that each wire adds two pounds to the total weight in aircraft, so reduction of the number of wires used can be important. No other thermal switch is known to be able to operate on the two-wire loop, 20 mA-powered circuit. It is noteworthy that other thermal switches require higher power levels requiring expensive electrical conduits and furthermore, lack the inherent, intrinsically safe feature provided by this invention. "Intrinsically safe" is an industrial term for a device powered at such a low level that it could not initiate an explosion from the worst spark possible in the presence of an explosive gas/air mixture. The term "4–20 mA loop" is used generally herein, but the current could be as high as 25 mA to signal a special condition such as a failure. The current could also be as low as 0 mA to signal other conditions.

BRIEF DESCRIPTION OF THE DRAWING

The objects, advantages and feature of the invention will be more clearly perceived from the following detailed description, when read in conjunction with the accompanying drawing, in which.

DETAILED DESCRIPTION OF THE PREFERRED EMBODIMENTS

Figure 1:
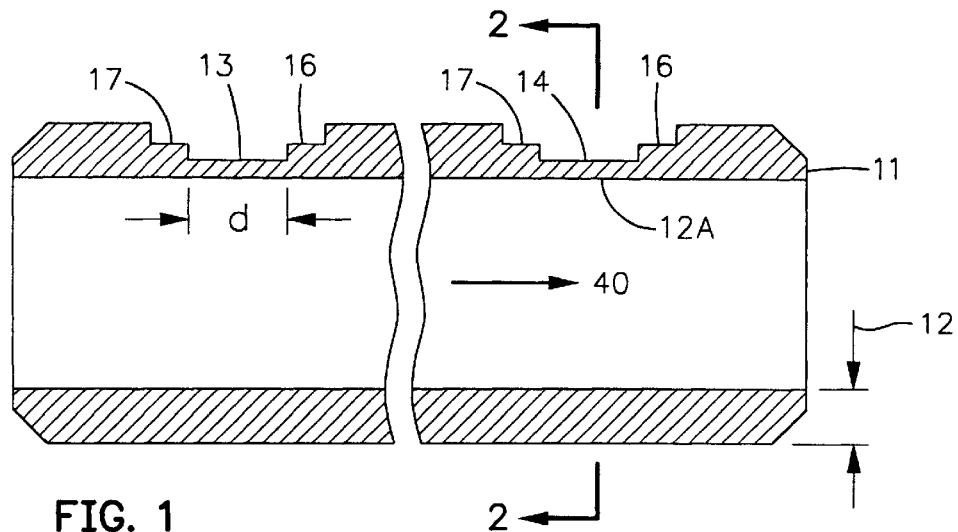
FIG. 1 is a cross section of a conduit segment showing a normally flat reduced thickness area constructed in accordance with the preferred embodiment of the invention.
Figure 2:
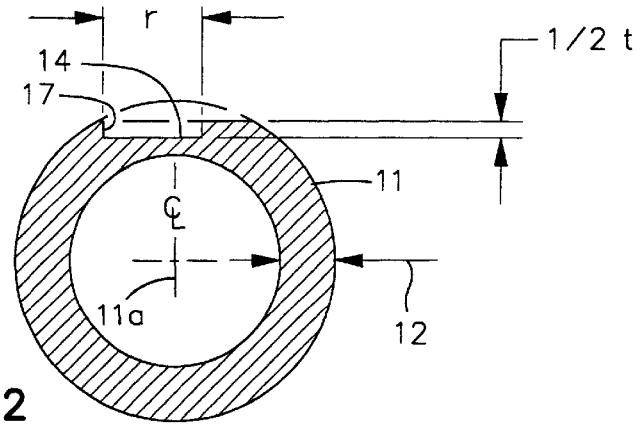
FIG. 2 is a cross section along cutting plane 2—2 of FIG. 1.

With reference now to the drawing, and more particularly to FIGS. 1 and 2, pipe segment 11, which may be stainless steel, having wall thickness 12, is shown with stepped reduced thickness regions, areas or detents 13 and 14. In operation, pipe segment 11 is preferably connected in a conduit line having substantially the same inner diameter so the pipe segment has no influence on the fluid flowing therein. The reduced thickness areas are configured to closely receive and confine sensor or detector chip 15 of FIG. 3. Since detents 13 and 14 are substantially identical in most instances, the following description will generally refer only to one of them. Shoulders 17 are provided to define the detents for close fit of chip 15, and for manufacturing convenience. The invention can function satisfactorily with only a flat surface on which the detector chip resides, without having a detent between shoulders 17. It is, however, preferred that there be a detent for positive positioning of the tiny detector chip. In addition to having access to the electrical leads, it has been found to be convenient to create first reduced thickness portions, leaving shoulders 17, and then to make the further reduced thickness areas 13 and 14. Both levels of these detents are typically formed by an electric discharge machining (EDM) process, although other means could be employed. Further, while these areas are shown reduced in thickness from the outside, they could be oppositely formed so that the outside surface of the pipe or conduit is uninterrupted and the thinning takes place from the inside. This is, of course, true of all embodiments disclosed or suggested herein.

In order to be sure that terminology is clear, a tank, standpipe or conduit has a "wall" in which is formed a "detent," and on the other side of the wall is the "surface" 12A which is in contact with the fluid or media being sensed. In this technology area, the term "mixing" refers to a container where fluids are mixed and the operator needs to know if mixing is occurring; "condition" relates to the viscosity of the media; "interface" relates to non-miscible or separable substances, such as sand/water, oil/water, among others.

As a specific example, conduit segment 11 has an outside diameter of 0.25 inch (6.35 mm), a wall thickness 12 of 0.035 inch (0.89 mm), and is made in a seamless tube of 316L stainless steel. Other materials could be employed. It is contemplated that the line size of conduit segment 11 would range from 0.25 to 4 inches (6.35 to 101.6 mm). The optimum thickness of the wall of pipe 11 at reduced thickness areas 13 and 14 is approximately 0.003–0.004 inch (0.076–0.102 mm) for a stainless steel pipe. Thus it can be seen that the thickness of the wall of pipe 11 at detents 13 and 14 is only about ten percent of the wall thickness 12. The actual thickness or relative thickness is not the important factor. What is important is that the thickness of the wall between the sensor chip and the media being sensed be an operationally effective thickness. The operationally effective thickness of a conduit wall will differ substantially, depending upon the working pressure in the conduit and the material from which it is made. A highly thermally conductive material can have an operationally effective thickness greater than a moderately thermally conductive material. One of the key parameters is that the sensor have an acceptable response time, preferably less than ten seconds. There may be situations where a longer response time would be acceptable and when that is true a thicker wall at the detent would still be an operationally effective thickness. Also, owing to the small size of chip 15 and supporting shoulder 17, high pressure can be tolerated even though only a thin membrane exists between chip 15 and the media pressure. It would also be possible to support the chip with a non-thermally conductive structural member if higher pressures are to be encountered, or fast response is required, for example.

Further, an operationally effective thickness is one where the heat carried away from the heated sensor chip is in great measure due to the media being sensed at the detent and very little is due to outward radiation or to axial or circumferential conduction along the conduit wall. Properly insulated, substantially all the heat generated in the self-heated chip will be transferred to the media. It is important that the heat be dissipated before it can heat the reference sensor. This is most difficult at low or no flow rate of the media. The FIG. 1 embodiment meets those requirements. Note however, that the separation of RTDs in detents 13 and 14 is dependent upon the line size, typically no more than about three inches, the line wall thickness, and the insulation, if any, around the pipe or line. The separation distance needs to be experimentally determined, dependent on the heat transfer conditions.

Figure 6:
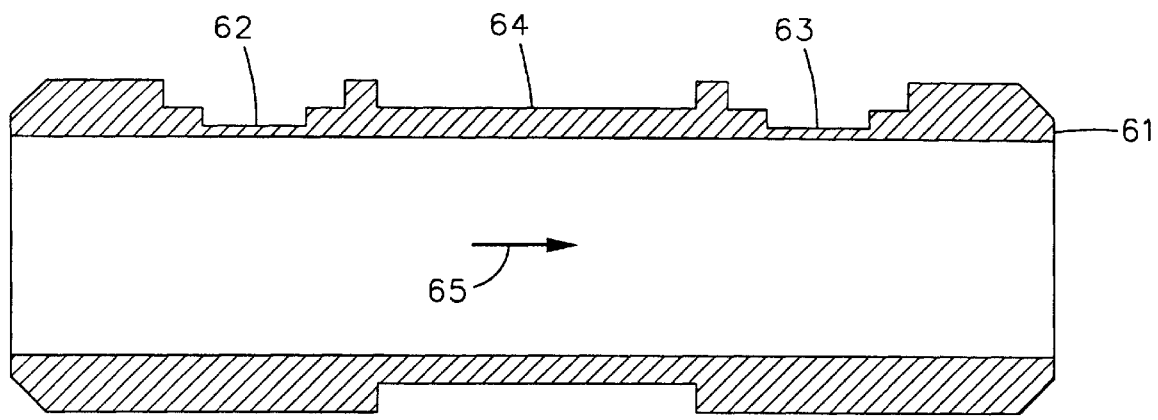
FIG. 6 is a cross section showing an alternative embodiment of the conduit segment of FIG. 1.

An alternative embodiment of pipe segment 11 is shown on FIG. 6, where pipe segment 61 is assumed to be the same diameter but can be shorter than the FIG. 1 embodiment. This assumption is for expository purposes only. Detents 62 and 63 have the same configurations as the FIG. 1 embodiment, that is, the pipe wall thickness at the thinnest location would be about 0.003 to 0.004 inch (0.076 to 0.102 mm). The improvement is in the circumferential removal of material from the pipe wall between the detents. This creates circumferential reduced thickness area 64 which may have a thickness somewhat thicker than the wall thickness at the detents, for example, about 0.010 inch (0.254 mm) or somewhat thicker in a 0.035 inch (0.89 mm) thick pipe wall. By reducing the wall thickness between the detents, thermal resistance is increased and even less heat will be carried along the pipe wall to the reference sensor to be located in detente 62, assuming flow in the direction of arrow 65. This embodiment is especially useful in providing accurate readings at very low flow rates or even at no flow. For purposes of this invention very low flow rates are considered to be zero to about 5 cc/minute for gas, and zero to about 1 cc/minute for liquid. The FIG. 6 embodiment is therefore capable of the accuracy desired from zero flow to any practical flow rate in a conduit. The only limitation of the FIG. 1 embodiment is that it has a practical lower limit at about the very low flow rate defined above. A further advantage of the FIG. 6 embodiment is that it permits thermal isolation in a pipe segment shorter than the pipe segment of the basic embodiment of FIG. 1. There are instances where a length limitation exists and merely shortening the FIG. 1 embodiment so that detents 13 and 14 are closer together could result in thermal crosstalk between the detector elements in those detents, absent reduced thickness area 64 in FIG. 6. In some instances it may be necessary to reduce the thickness of the ends of pipe segment 61 to control the effect of ambient temperature variations.

Figure 3:
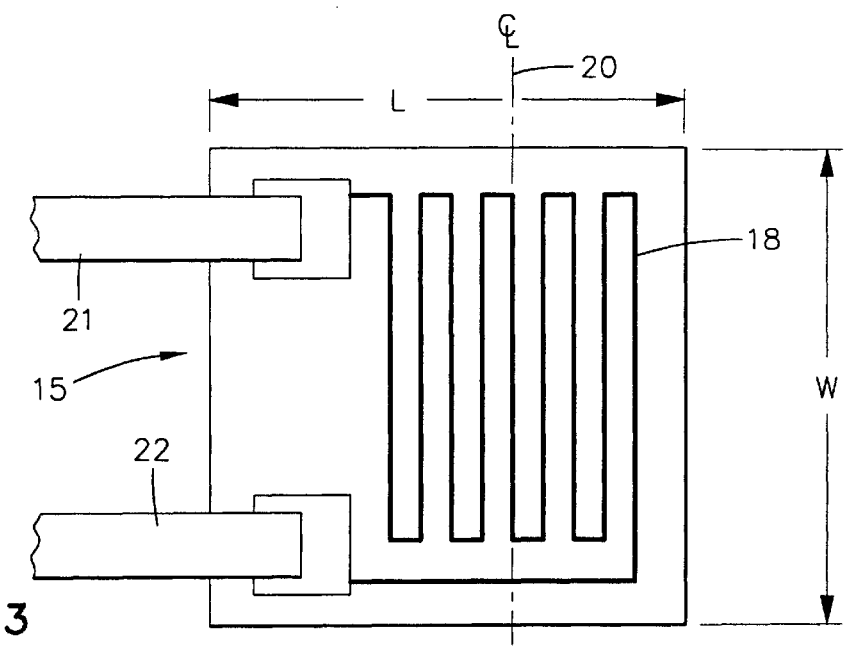
FIG. 3 is a plan view of a temperature sensitive resistance element (RTD) used with the invention.
Figure 3A:
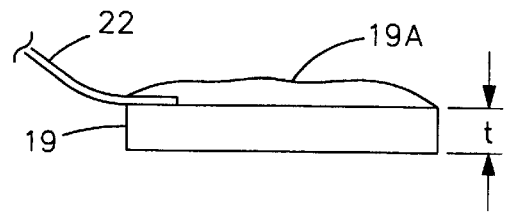
FIG. 3A is a side view of the RTD used with the invention.

As contemplated for use with the configuration of FIGS. 1 and 2, sensor or detector chip 15 of FIG. 3 has a width W of about 0.05 inch (1.27 mm) and a length L of about 0.07 inch (1.78 mm). As seen in FIG. 3A, the thickness t of substrate, structure or base 19, by way of example, is about 0.01 inch (0.254 mm). The thickness of serpentine electrical resistance 18 is so thin as to be insignificant, even in the scale of FIG. 3A. There is typically a glass protective surface 19A over resistor 18, shown as an irregular surface here. In order for chip 15 to fit closely within detents 13 and 14, the longitudinal dimension d in FIG. 1 is preferably 0.055 inch (1.4 mm) with a tolerance of ±0.002 inch (0.051 mm). The length r of the reduced thickness area as shown in FIG. 2 is preferably about 0.075 inch (1.905 mm) with a tolerance of ±0.002 inch (0.051 mm). Referring to FIGS. 1 and 2, the depth of detents 13 and 14 from shoulders 16 and 17 is approximately 0.002–0.004 inch (0.051–0.102 mm), allowing adequate clearance for lead wires 21, 22. It should be noted that the same sensor element 15 resides in both detents 13 and 14. Each merely has a different function, one being deliberately heated and the other being unheated.

It is preferred that chip 15 be arranged in detents 13 and 14 so that leads 21 and 22 extend laterally with respect to pipe 11. That means that length L of the chip is no longer than length r of the detent and width W of the chip is no wider than dimension d of the detent. This ensures that centerline 20 of resistance element 18 is directly over centerline 11A of pipe 11. From FIG. 2 it is seen that the pipe wall is thinnest over the pipe centerline and that the preferred minimum thickness of the round pipe wall at the detent is about 0.03 inch (0.76 mm) and increases as the distance from the center increases. By mounting the chip so that the resistance element is evenly balanced on either side of the thinnest point of the detent, the greatest accuracy and efficacy of the RTD response is achieved. This requires that detent 14 be laterally offset slightly as shown in FIG. 2 to accommodate the fact that centerline 20 of the resistance trace is not at the active or effective center of the substrate (see FIG. 3).

It can thus be seen that detector chip 15, when placed in detent 14, will be closely confined and will be at the area of thinnest material between the bottom of the chip and the flowing fluid within conduit 11. Temperature sensitive resistance element 18 shown as a raster pattern trace on the electrically insulative substrate, is spaced a very short distance from the flowing fluid and that space is occupied by highly thermally conductive material. Thus resistance element 18 will immediately respond to differences in temperature between the resistance element and the flowing fluid. That is, when the resistance element is heated substantially above the temperature of the fluid within conduit 11, the rate of flow of the fluid will determine the temperature of the resistance element and thereby the resistance of that element within a very short time, normally less than 10 seconds. A higher velocity of fluid flow within the conduit causes a greater amount of heat to be dissipated and thereby a greater change in the resistance of element 18 on the chip. Further, when the material flowing through the conduit is a liquid, it will carry away much more heat than would a gas and thereby the resistance element of the invention can easily determine whether the fluid flowing within the conduit is liquid or gas. Also, flow past the chip is laminar and is thereby a fraction of the main stream flow rate. The laminar boundary layer only carries away a fraction of the heat of the turbulent flow surrounding the probes of prior art insertion sensors employing thermal wells. This permits the device of FIGS. 1 and 2 to sense flow rates over a wider range than is possible in the known insertion devices.

Similarly, if liquid level is to be determined in a generally upright container or standpipe, one or more of the detector chips 15 can be located in detents 14 in the side of the container or standpipe. Based on the fact that air on the inside of the container would dissipate little or no heat whereas liquid on the inside would dissipate a substantial amount of heat from the heated detector, this invention can usefully be employed as a liquid level detector. The words "container" or "conduit" continue to be used herein for convenience to encompass a standpipe, a liquid container and a fluid conduit.

Figure 4:
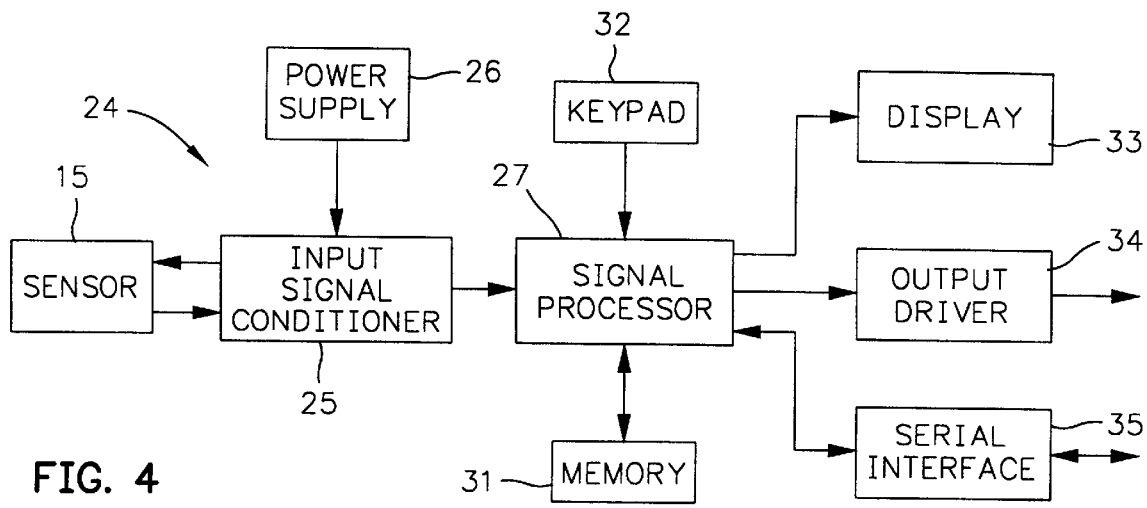
FIG. 4 is an example of a circuit in which the detector chip of FIG. 3, as mounted in the structure of FIGS. 1 and 2, can be connected.

An exemplary circuit 24 which can provide the desired output signals based upon the outputs of the detector elements appears in FIG. 4. It should be understood that there may be many different configurations of circuitry which will properly process the signals from sensors 15 and provide appropriate outputs indicative of liquid level or mass flow rate. As shown in FIG. 4, sensors 15 are connected to input signal conditioner 25 which is powered by power supply 26. This same power supply provides the power to the detector chips. The output of signal conditioner 25 is connected to signal processor 27 which may have memory 31 and may be externally controlled by keypad 32. The signal processor may supply output signals to an indicator or display 33. The output may also be fed to output driver 34 for other external processing and, similarly, to serial interface 35. The important thing is that the circuit of FIG. 4 provides appropriate signals which can be used for any or all purposes of displaying the indications of phase change or rate of mass flow through the conduit, or feeding signals to other control or indicator elements to cause other actions to happen, as desired. Similarly, an analog circuit could be provided for purposes of sensing the temperature difference between the chips or the resistance of each chip individually.

As a further explanation of the manner in which temperature sensitive resistance devices, for example, RTDs, operate, assuming fluid flow is in the direction of arrow 40 in FIG. 1, a reference RTD chip 15 resides in detent 13 and a heated or active RTD chip 15 resides in detent 14. In the preferred arrangement the chip in detent 13 is unheated and is powered only sufficiently to provide a return signal which is the reference signal in this device. RTD chip 15 residing in detent 14 may be self heated to as little as a few degrees or as much as 100° C. or 200° C. above the temperature of the fluid flowing in tube 11. Alternatively, a separate compact heater could be employed to heat RTD 15. The circuit of FIG. 4, under steady state conditions, records the temperature and the temperature differences between the reference chip and the heated chip, and any variation in that temperature differential ($\Delta T$) will relate directly to the mass flow of the fluid in the conduit. Alternatively, a change in $\Delta T$ can also relate to a static or no-flow phase change between liquid and gas or indicate a change from one liquid to another where the liquids in a vessel are relatively motionless and are non-miscible.

Returning to a discussion of flowing conditions, inputs to memory 31 of the circuit of FIG. 4 would include the characteristics of the fluid/media flowing in conduit 11. For example, if it is known that a liquid is the media flowing through the conduit, the signal processor would have representations of the specific heat, thermal conductivity, media temperature, density, viscosity and other physical qualities related to heat transfer rates of that media. Then, differences in the rate of flow of that liquid results in differences between the active and reference RTDs by which a controlled amount of heat can be carried away from active sensor 15 in detent 14 of the conduit. The circuit then puts out a signal which directly indicates the flow rate of the liquid in that conduit by sensing the resistance/temperature differences between the heated RTD and the media temperature sensing unheated RTD (temperature sensors).

The same thing is true if the fluid is a gas, except that the physical qualities are much different than for a liquid. For example, gas can be compressed. The relevant information would be entered into the signal processor and it would interrogate the memory, or have been pre-programmed in a simplified circuit, for the characteristics of that fluid so that the system accurately determines mass flow rate of the fluid in conduit 11.

Of course, liquid carries away heat more easily than does gas so adjustments would have to be made, for example, by entries through the keypad and the memory of FIG. 4, to accommodate the differences in the ability of the fluid in the conduit to carry away heat. Alternatively, in a simplified circuit, the circuit could be pre-adjusted to accommodate the liquid in the duct in a manner similar to that discussed above in the gas illustration.

It is important to note that the flow rate sensing apparatus of this invention is not sensitive to variables of pressure (with the possible exception of the embodiment shown in FIG. 19) at any flow rate which result in density variables in gases and thereby causing other sensors, including, for example, orifices, direct contact or mechanical flow paddles or devices using thermal wells at low flow rates, to have outputs which must account for pressure in the conduit. That pressure sensitivity includes the magnetic switches which were alluded to in the introduction. The present invention does not have this disadvantage in that a single unit made in accordance with this invention, being subject to pressure differences, can directly measure mass flow rate of gases at a wide range of pressures of interest to the user. Also, the device of the present invention can be adjusted in the factory or in field use to any mass flow rate trip point by means as simple as a potentiometer in the FIG. 4 circuit.

The detector chip contemplated to be used in the preferred embodiment of this invention is the EL-700 thin film platinum RTD chip from Hycal. Alternatively, a competitive element can be purchased from RdF Corporation. While any small, preferably flat-sided temperature sensitive element can be used, the platinum RTD chip identified above is preferred. Platinum RTD element 18 is deposited on silicon oxide substrate 19, the substrate providing excellent electrical insulation while being a good thermal conductor. As stated previously, RTD element 15 has dimensions of about 0.05×0.07×0.01 inch (1.27×1.78×0.254 mm) and measures 1000 ohms at 0° C.

The chip is shown as being a relatively rigid substrate device residing on a flat surface. It is quite possible that chip 15 can be formed to conform to a curved (cylindrical, conical or spherical, for example) surface, or that the structure or base can be made from a flexible material so that it can be made to conform to the contours of the surface to which it is to be mounted.

In the preferred embodiment, by self heating the detector chip 100% efficiency is obtained in getting the desired heat to the heated element as compared to devices with separate heaters. In devices where the active sensor is heated by a separate heating element, the efficiency is much lower. Also, by self-heating a small sensor of the type shown in FIG. 3 there is much improved efficiency compared with heating a larger element in terms of temperature generated per unit of power. It is also important to thermally isolate the two sensors one from the other and from the variations in ambient conditions to attain high thermal efficiency so that the system can operate on approximately 0.1 watt of power. As a matter of fact, as compared with the model FLT-93S previously mentioned, and other heated sensors of that type, the flow sensor of this invention operates on about one twenty-fifth of that power.

By reducing the wall thickness in the conduit and preparing a small flat surface in that reduced thickness area a significant increase in thermal efficiency is achieved compared with those which mount a temperature detector on the non-specially prepared external surface of the fluid conduit. In addition, the flat surface prepared as shown in FIGS. 1 and 2 perfectly matches the flat surface of the chip of FIG. 3. Best results for small fluid transport lines will occur if the normal flow is upward and the reference sensor is located at the inlet and the heated sensor is near the outlet.

The device according to the invention is able to operate, because of its small size, on as little as 0.025 watts of power as compared with 60 watts specified for at least one of the otherwise available surface mounted thermal detector elements. By operating at such low power values, the present invention is able to achieve other important electronic benefits, among them being:

Nominal operating voltage level of the circuit board on which the circuit of FIG. 4 is formed is 18 volts DC. If the power supply is 24 volts DC, a simple voltage regulator is all that is needed to condition the voltage. If the supplied power is 110 volts AC, a rectifier, small capacitor and a dropping resistor are sufficient in addition to the 18 volt regulator. This is much more compact and less costly than would be a transformer necessary to reduce the voltage for larger power requirements. Even if a transformer is used, the reduced power needs will result in a smaller, less costly transformer which can be housed in a smaller, less costly enclosure or housing. This thereby eliminates the need for a large transformer and a large electrical enclosure, offering even further improved cost advantage not only in the parts used but also in reduced size of the relatively costly enclosure.

Exclusive operation on an increasingly popular intrinsically safe single wire loop of 4–20 mA of current. By using such a loop, the end user can save great amounts of money over systems which usually require four, five or six wires, normally routed in an electrical conduit which is also an added cost. The low power also permits an intrinsically safe rating or less expensive wiring means, or both, and provides a very high level of safety.

Operation of multiple sensors at diverse positions on the same wire loop by signal conditioning, resulting in further savings. A growing trend is to require the use of a single loop with the low current level mentioned and addressing individual sensors on the loop by digital, frequency or by other separating means.

Operation on only two wires, in addition to being electronically and financially desirable, saves approximately two pounds (0.92 kg) per wire eliminated in aircraft. In other words, where it was previously necessary to have six wires for the sensors of the type of the present invention, an eight pound (3.68 kg) inferred weight saving for each airplane is achieved if only two wires are employed rather than six.

The low power requirements for the sensor of this invention are directly related to the mounting and the size of the sensor element on the substrate. The size of the chip as previously discussed is about 0.07 by 0.05 inch (1.78 by 1.27 mm). It is preferred that the sensor on the chip surface occupy no greater than 0.001 square inch.

The chips of FIG. 3 were originally manufactured as temperature sensors and the ones mentioned above as commercially available of the type of FIG. 3 are rated at −200° C. to 540° C., that is, they can very accurately and consistently detect temperatures within that range. These same sensors are being employed in this invention not only as a heater but as a combined heated temperature sensor. This would normally be unexpected because to self heat a temperature sensor would, in most cases, defeat its intended purpose. Chip type RTDs, as shown in FIG. 3, are the preferred temperature sensor elements because of their great accuracy and for other reasons addressed herein.

Chips 15 are adhered in detents 13 and 14 by a suitable compound of high thermal conductivity, such as a room temperature vulcanizing rubber adhesive. The preferred material is manufactured by Dow Coming under the trade name Silgard. This bonding agent can be effective to secure the chip to the detent even as it is squeezed as thin as possible by mechanical or vacuum means. It is important to exclude air from the area between the chip and the detent surface and to maintain a consistently thin layer of adhesive material from unit to unit as product is produced so that each succeeding unit performs much as the preceding unit did.

Figure 5:
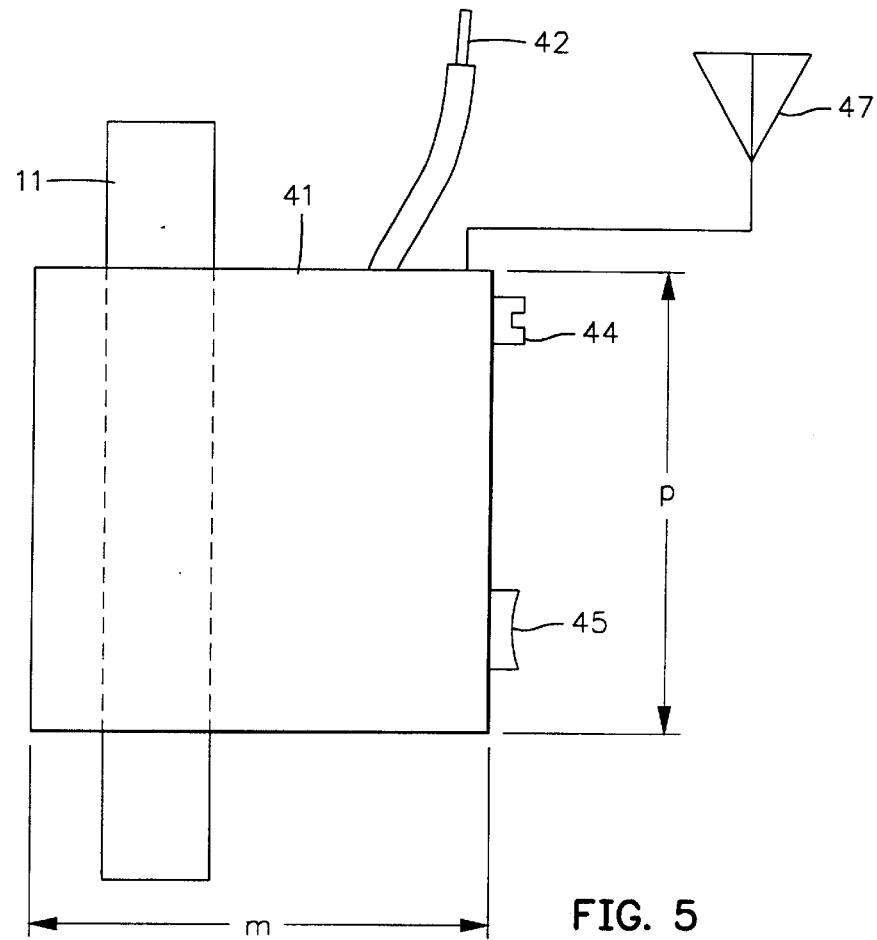
FIG. 5 shows the relationship of the housing for the switch/transmitter of the invention and circuit of FIG. 4 with respect to the fluid conduit in which flow is to be monitored.

The following are some examples of how the invention, employing the chip of FIG. 3 in a two wire loop, might operate. In an airplane, for example, it might be desired to detect the flow rate of a liquid or a gas in a 0.25 inch (6.35 mm) diametertube. The outer tube wall would be prepared with the detents as shown in FIGS. 1 and 2 and a small electronic enclosure as depicted in FIG. 5. Assuming tube 11 is 3.25 inches (82.55 mm) long, enclosure 41 is one inch (25.4 mm) wide (dimension m) and about 1.25 inches (31.75 mm) high (dimension p). The enclosure would typically be about 0.625 inch (15.88 mm) in thickness around the 0.25 inch (6.35 mm) tube 11. Only two wires are used in cable 42 with the weight savings mentioned above. Potentiometer control 44 and on/off push button switch 45 are shown projecting from enclosure 41. If required, media temperature compensation can be provided within enclosure 41. As an option, antenna 47 may be employed for communications to and from the circuit within enclosure 41.

A steady 10 mA (approximate) current is supplied to sensors 15 and to the related electronics and, at no flow, the remote indicator would read 10 mA of current after the output of the sensors is passed through the circuit of FIG. 4. This would indicate no flow in conduit 11. If the flow rate went to 100 SLPM the instrument would draw an additional 10 mA of current due to the heat dissipated from heated element 15 and, by previous calibration, this would be indicated as 100 SLPM. With this calibration, 10 SLPM would draw 11 mA, 20 SLPM would draw 12 mA, and so on, with intermediate flow rates drawing a proportional current.

As another example, the sensing device of the invention may be devised as a liquid level point sensor and the external surface of the container of liquid or the pipe in which liquid stands would be prepared as shown in FIGS. 1 and 2. The output of the circuit of FIG. 4 will indicate whether gas, oil or water is present. If air or gas is present, the instrument will draw 10 mA, all of which is used to operate the instrument. If oil is present, 15 mA will flow, for example, resulting in 5 mA being "sunk." If water is present, 20 mA will flow through the detector chip and 10 mA are sunk. These results stem from the fact that the cooling effect of air is very low. As a result, with constant heater power a high differential electronic resistance between the heated and reference, or unheated, sensors occurs. The 10 mA is used to heat the heated sensor and operate the electronic package and no extra current is sunk. With still only 10 mA flowing, the liquid level rises and affects the mounting surface adjacent the sensor with the oil, which is assumed to be floating on the water. The cooling effect increases and an intermediate differential temperature results, causing an intermediate differential resistance to occur. This will be signaled by drawing and sinking an additional 5 mA, thereby signaling that oil is present. Assuming no action is taken by the operator and the level of liquid continues to rise until water has displaced the oil, the greater cooling effect of water will further reduce the differential temperature. This reduced differential resistance is used to cause a total of 10 mA to be sunk, thereby signaling that water is present. While the above example considers a constant heater current, it would be possible, but less desirable, to use variable voltage, maintain a constant $\Delta t$ at the two sensors and use power consumed to indicate air (least heater power), oil (intermediate heater power), and water (highest heater power).

As an alternative embodiment, it is possible to attain substantially the same results in a time sharing fashion with a single detector chip 15. When the circuit is initially energized the resistance/temperature is recorded immediately in the circuit memory. Then the continuing power is allowed to heat the chip with the known current which would provide a known temperature rise in air. The circuit of FIG. 4 then subtracts the initial reference temperature/resistance from the later achieved temperature/resistance to indicate the presence of air or liquid. While this alternative embodiment will work, subsequent to the initial start up, it would take somewhat more time than would the two-detector chip embodiment of FIG. 1. A scheme employing this general principle is currently being used in the aerospace industry. Because of the large size of the heated sensor in the schemes employed prior to the present invention, approximately 80 mA were required to heat the single RTD circuit and intrinsic safety is not attained as in the reduced current embodiments of this invention. Similarly, a flowing media of known physical properties can be interrogated at the moment of energization and again a short time later. The temperature rise would be indicative of the media flow rate.

Although the time share embodiment is somewhat slower than the two detector chip embodiment, it is still relatively fast and rapidly changing conditions can be handled by the time share system. The cycle time is fast because of the low thermal mass of the detector chip and the excellent thermal bonding to the media (the thin-walled detent) and its isolation from the environment made possible by the box 41 of FIG. 5.

An alternative method of operation would be to hold the sensing elements at a fixed temperature differential to measure flow rate with the apparatus of this invention. At like flow rates, additional power would need to be supplied when oil is present, as compared to air, and even higher power would be needed when water is present as compared to either air or oil.

When the mode of operation employs a constant voltage system, a constant voltage is applied to each element and a higher current would flow in the presence of either oil or water as compared to air. As stated before, the constant current embodiment is preferred. While the invention has been described with respect to a small diameter conduit as shown in FIGS. 1 and 2, and has been discussed with respect to a standpipe of any size and to a larger container for liquid level detection, it is possible by the use of electric discharge machining (EDM) to make the thin-walled surface preparation of FIGS. 1 and 2 in the side wall of a container or duct of any shape. Thus the principles of the invention apply to any size or shape vessel or conduit which contains liquid or allows fluid of any type to pass therethrough. Note that while the discussion relating to gas, oil and water generally referred to liquid level, the device of the invention could also detect fluid flow in a horizontal (or arranged at any other angle) pipe. It can provide indication of and distinguish between liquid flow intermittent with gas flow. There are many instances where it would be very important to know when liquid stops flowing and gas is the only substance within the conduit or vice versa.

The invention could be used as a flow direction sensor where the two chips in detents 13 and 14 are equally self-heated. Flow in one direction would heat the downstream element to a higher temperature than the upstream element is heated because of the warmer fluid in the slipstream of either sensor being hotter than the cool fluid bathing the upstream unit. This would result in heat being dissipated at a higher temperature by the downstream sensor.

A simple comparator circuit would sense the two temperatures as a resistance and would indicate no flow if both were equal and flow toward the highest resistance no matter which direction the flow is going. Direction is easily determined by the circuitry connected to the sensor outputs.

Figure 7:
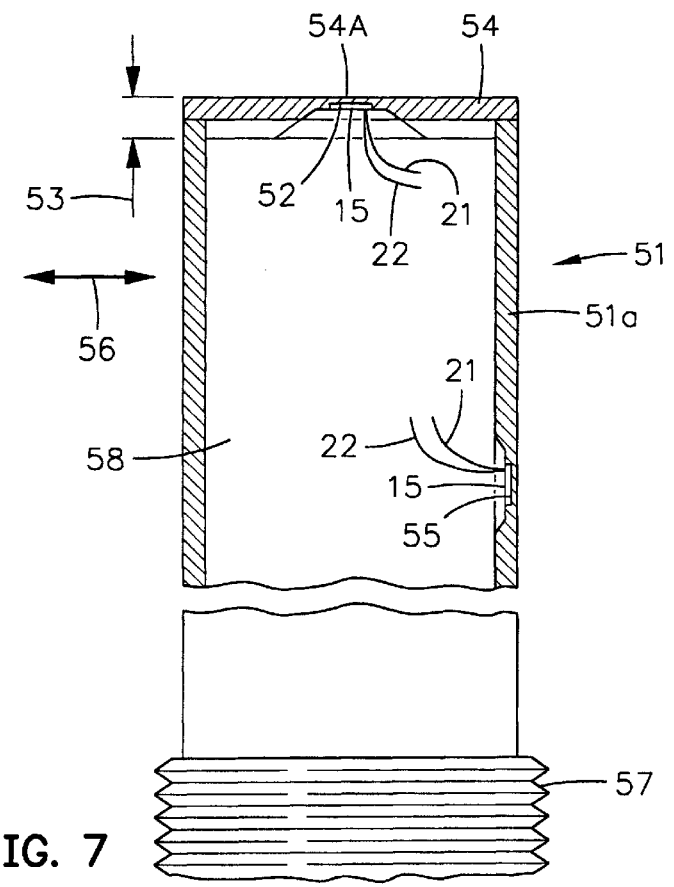
FIG. 7 is a cross sectional view of an alternative embodiment of the invention constructed as an insertion device.

The principles of this invention are employed in the alternative embodiment shown in FIG. 7. Probe 51 is configured as an insertion device for large lines or on the top of or through the sides or up from the bottom of tanks. The active or heated sensor chip 15, having lead wires 21, 22, is mounted in detent 52 which is formed in the manner previously described with respect to FIGS. 1 and 2. The thickness 53 of end cap 54 maybe equivalent to the thickness of the wall of pipe 11. However, the only parameter required is that the distance between chip 15 and the outside surface 54A of end cap 54 be extremely small, in the order of 0.003–0.03 inch (0.076–0.76 mm). Reference sensor 15, having its lead wires 21, 22, may be mounted in detent 55 in side 51A of probe 51. Detent 55 in the side wall of probe 51 is also prepared as previously described with respect to detents 13, 14 and 52, with equivalent thickness of the wall between the sensor chip and the media being detected. Using the terminology established earlier, end cap 54 may be referred to as a wall and reference numeral 54A refers to the surface in contact with the media.

Threads 57 are the means by which probe 51 is mounted to the wall of a conduit or tank. The length of probe 51 can vary, depending on the size of the duct or conduit or the tank depth into which the probe projects. It is contemplated that the insertion probe embodiment of FIG. 7 could be used from as small as 0.75 inch (19.05 mm) diameter to any large size line, vessel, or container. It is preferred that the external face of end cap 54 be positioned in the middle of the flowing fluid in the conduit.

The FIG. 7 embodiment will generally be used in large conduits since it is inserted directly into the path of the media being sensed (either level or flow). It is contemplated that the diameter of probe 51 will be approximately 0.75 inch (19.05 mm), thereby allowing laminar boundary layer flow to form on the flat end. This embodiment will function properly if laminar flow does not occur—it will not always do so.

The insertion device of FIG. 7 would be useful in large diameter ducts wherein it could be uneconomical to prepare the surfaces 13 and 14 of FIG. 1 in the sides of, for example, a 2 foot (62 cm) diameter water pipe. The flat surface of the end of the insertable sensor would still act the same as the inside of the tube of FIG. 1. That is, even in a turbulent flow field in a large duct, a local laminar flow field would exist on the flat end of the element. This configuration would act in the same way with the same benefits as found in the non-intrusive structure of FIGS. 1 and 2.

The FIG. 7 embodiment shows spaced sensor locations 52, 55 in end cap 54 and in the side wall. It is possible, when two sensors are employed, to position them both on the side wall, effectively thermally spaced. It is also contemplated that cavity 58, that is, the inside volume of probe 51, can be evacuated if desired. This has the advantage that no cooling of the RTD element by natural convection will occur within the probe.

Figure 8:
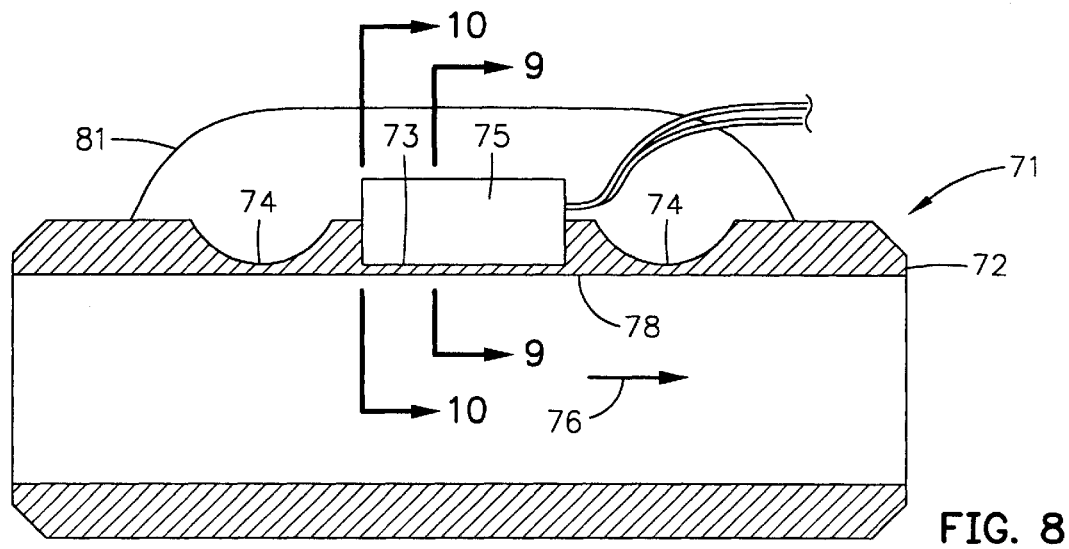
FIG. 8 is an alternative embodiment similar to FIG. 6 of a conduit segment and a different RTD having a cylindrical shape.
Figure 9:
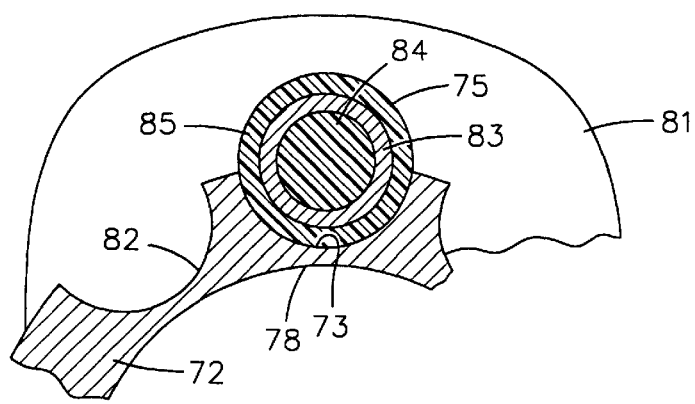
FIG. 9 is a partial cross sectional view taken through cutting plane 9—9 of FIG. 8.
Figure 10:
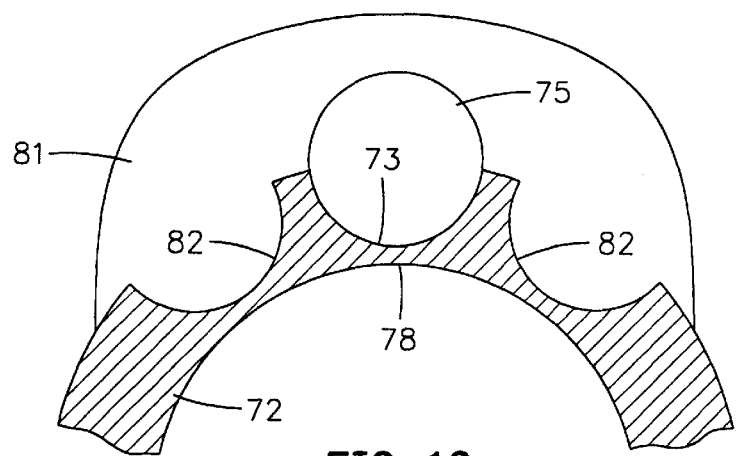
FIG. 10 is a partial sectional view taken along cutting plane 10—10 of FIG. 8.
Figure 11:
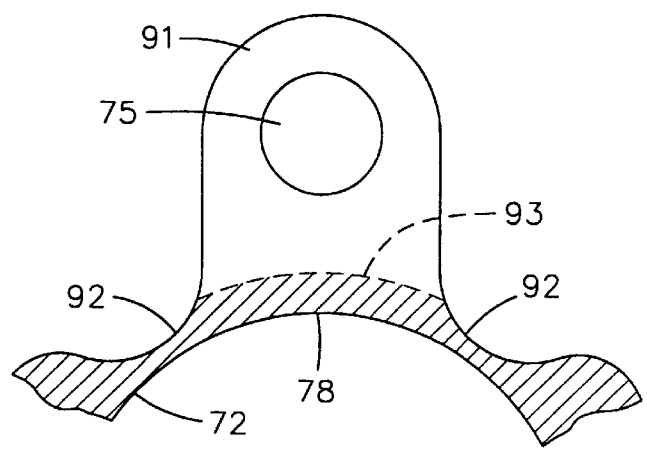
FIG. 11 is a partial cross sectional view of another alternative embodiment of the invention.

Further alternative embodiments are shown in FIGS. 8–10 and in FIG. 11. A cylindrical temperature sensitive element 75, typically an RTD, is mounted in detent 73 in wall 72 of conduit segment 71. Surface 78 is in contact with the media. Linearly or axially on either side of detent 73 are reduced thickness depressions 74. By greatly reducing the thickness of wall 72 axially adjacent the RTD, the thermally conductive path is equivalently reduced so there is very little heat escape conductively along the wall in the axial direction.

Similarly, depressions 82 are provided circumferentially on either side of the RTD in detent 73 to greatly reduce the possibility of conductive heat escape through wall 72 in the circumferential direction. Although not explicitly shown, depressions 74 and 82 could be connected to effectively create a moat around detent 73 and RTD 75.

RTD 75 is shown in cross section in FIG. 9. The RTD conductive area is indicated by reference numeral 83 surrounding insulative core 84 and surrounded by surface insulation 85. This is merely a different physical form for the RTD and it is not particularly related to the wall surface configuration of FIGS. 8–10. The RTD of FIG. 3 could also be used with this wall configuration. Also, it is possible to use either depressions 74 or depressions 82 and not both. That would depend on such things as basic wall thickness and conduit, pipe or container diameter.

In FIGS. 8–10 there is shown insulative, encapsulating potting material 81. This further enhances heat escape prevention. This encapsulation is not necessary or preferred, but it may be desired under certain circumstances. Such encapsulation can be employed in all embodiments of this invention. It may be made of any suitable material well known in this technical field.

Another alternative embodiment is shown in FIG. 11 where RTD 75 is mounted in lug 91 which is either a part of wall 72 or is thermally conductively mounted to the wall. Depressions 92 provide circumferential thermal flow resistance, and axial depressions 93 on either end of lug 91 perform the same way as do depressions 74 in FIG. 8.

As a further alternative, thermocouples, while very different electronically than RTDs, could be employed as the sensors in this invention where it is formulated as a flat sensor and mounted on the prepared surface as shown in FIGS. 1 and 2. Because of the small size a thermocouple would also permit a low power system to be employed. Transistors and semiconductors can also be used instead of RTDs but the preferred embodiment is the vapor deposited, laser shaped and trimmed silicon oxide substrate platinum RTD of FIG. 3.

In yet another alternative, sensor chip 15 could be employed as a means for sensing the temperature of the media in the conduit. A single RTD sensor would be used at each point at which temperature is to be sensed. The FIG. 4 circuitry can easily include a "temperature only" switch so that the circuit output would show media temperature and not flow rate or level.

In still another embodiment discussed above, the individual temperatures of heated and unheated chips can be sensed. In this format media or process temperature can be used as a further alarm in combination with the flow rate and/or liquid level sensing.

Another embodiment would employ the Peltier, Seebeck or Thompson effect wherein the active sensor would be cooled instead of heated. Still, the differential temperature would be related to flow, wet/dry, among others, as described above.

Figure 12:
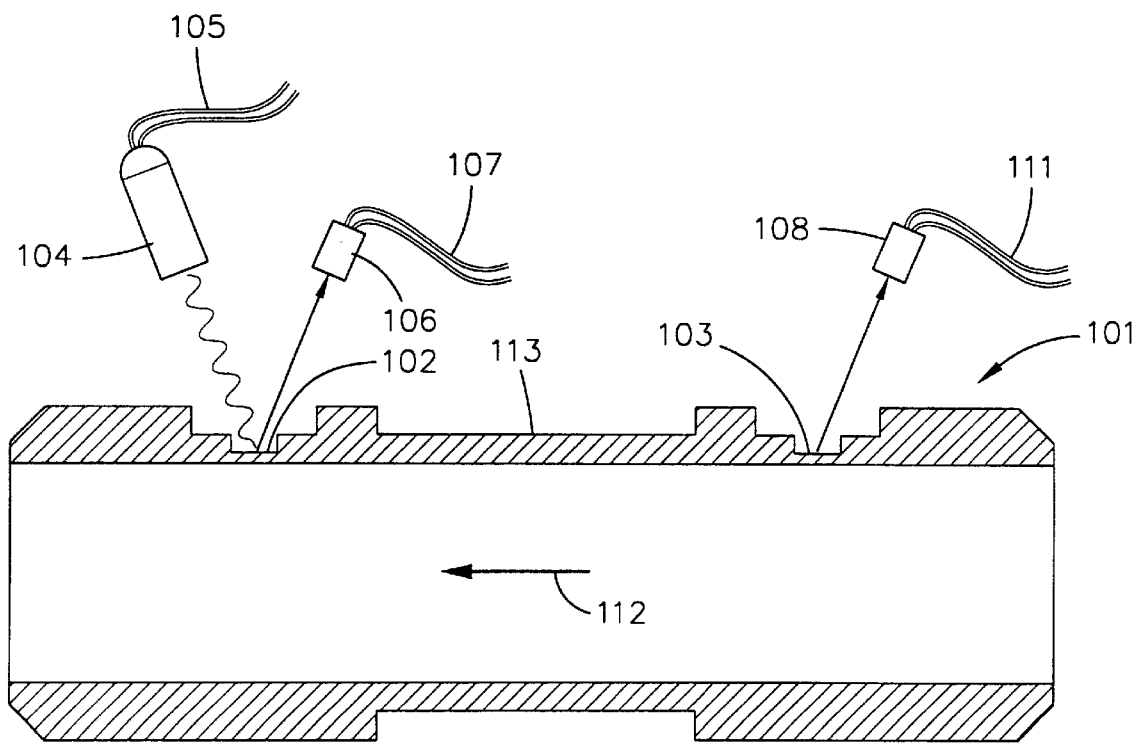
FIG. 12 is a cross sectional view of a further alternative embodiment of the invention.

A still further embodiment of the invention is shown in FIG. 12. Pipe segment 101 is configured much like the FIG. 6 embodiment, except that the detents 62 and 63 of FIG. 6 are replaced by much smaller reduced thickness areas or regions 102 and 103. These small regions actually become the temperature sensitive elements in the FIG. 12 embodiment.

A radiant energy source, such as a laser or other suitable narrow beam energy source 104, is connected to the control circuit by means of wires 105, selectively impinges energy directly on the surface of region 102 and heats it as desired. Temperature sensor 106, which could be an infrared or other radiant type sensor, for example, senses the temperature of region 102 and couples the resultant output signals by means of wires 107 to the control circuit. As disclosed previously, a single reduced thickness area may be employed and function in a time-share manner to act as both the active and as the reference sensor.

Preferably there will be a second reduced thickness region 103, the temperature of which is sensed by sensor 108, which is coupled to the control circuit by wires 11 1. Reduced thickness area 113 is preferably formed to isolate heated region 102 from reference region 103, functioning in the same way as area 64 in FIG. 6.

The key to the functioning of the FIG. 12 embodiment is the same as the earlier embodiments, that being a temperature differential, or ΔT, between the active (heated) and reference sensors. Fluid flow is represented by arrow 112.

Figure 13:
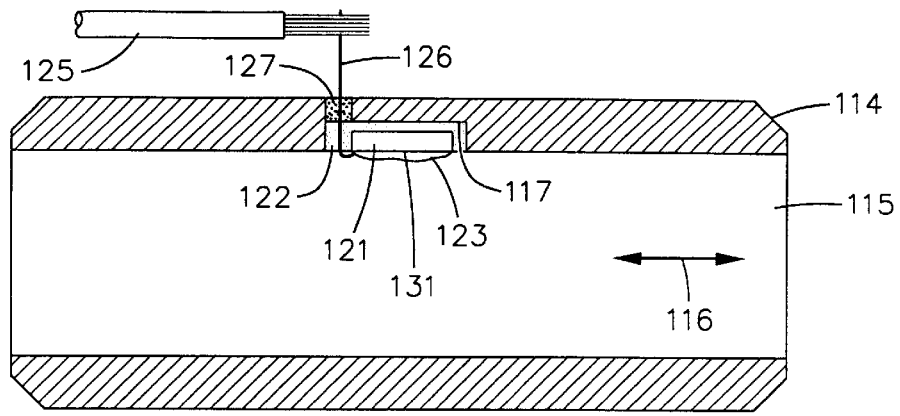
FIG. 13 is a cross sectional view of yet another embodiment of the invention.

Another alternative embodiment is shown in FIG. 13. This embodiment is especially applicable where the media in the conduit is not highly corrosive or hostile to the chip or the RTD. Fluid flows through conduit 11 5, defined by wall 114, as indicated by arrow 116. In detent 117 is sensor element or chip 121, which may be an RTD such as element 15 in FIG. 3. Detent 117 is much like detents 13 and 14 of FIG. 1. Insulative adhesive or bonding agent 122, such as an epoxy, secures sensor chip 121 in detent 117, substantially fills the space between the chip and the surfaces defining the detent, and provides resistance to thermal transfer from the chip to conduit wall 114. The surface of chip 121, the RTD surface, which would otherwise be exposed to fluid in the conduit, is covered and sealed by coating 123. That coating may be a thermally transmissive fused glass or other suitable materials, similar to coating 19A in FIG. 3A. Leads 124 of chip 121 are connected to exterior cable or stranded lead 125 by means of connectors 126 and are sealed in place by thermally and electrically insulative material 127, such as fused glass.

The purpose of this alternative embodiment is to further reduce the possibility of thermal dissipation directly from chip 121 to wall 114. Reduction of undesired thermal conduction or heat flow is a major purpose of the embodiments of FIGS. 6 and 8–12, and this FIG. 13 embodiment is another means to accomplish that purpose.

An additional purpose of the FIG. 13 embodiment is to bring the thermally responsive RTD element, on surface 131 of chip 121, as close as possible to the media being monitored in conduit 115. By being recessed into the inner surface of conduit wall 114 the RTD is under the boundary layer of the flowing fluid or media in the conduit. With the arrangement shown here, the RTD element on chip 121 is essentially in contact with the media, but for the protective, thermally transmissive seal, and minimizes the power required for heating the RTD element.

A further purpose accomplished by the FIG. 13 embodiment is to enable operation of the sensor on a 24 VDC, 4–20 mA powered, two-wire loop.

As an alternative, chip 121 in FIG. 13 could be reversed so that the base of the chip substrate is exposed to the media and the RTD element on surface 131 faces the bottom of detent 117. As discussed previously, the chip substrate is very thin and is highly thermally conductive, so the RTD element is still responsive in this alternative arrangement.

Figure 14:
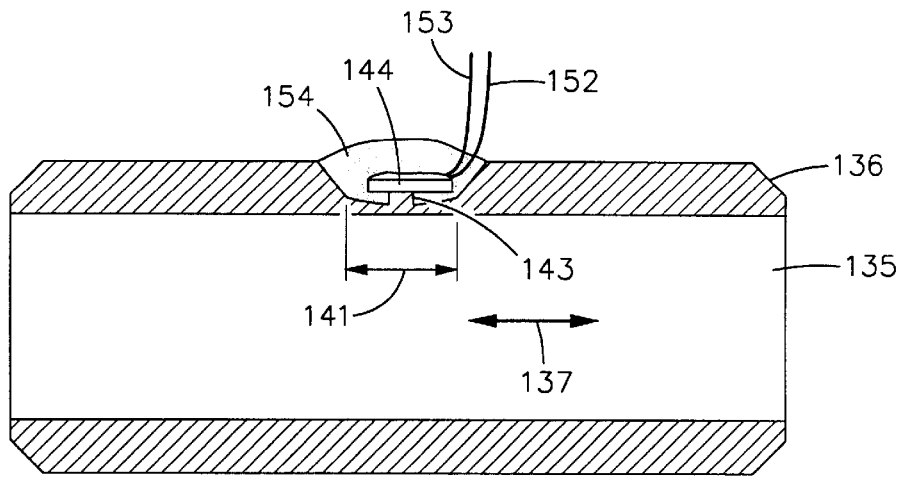
FIG. 14 is a cross sectional view of a further embodiment of the invention.
Figure 15:
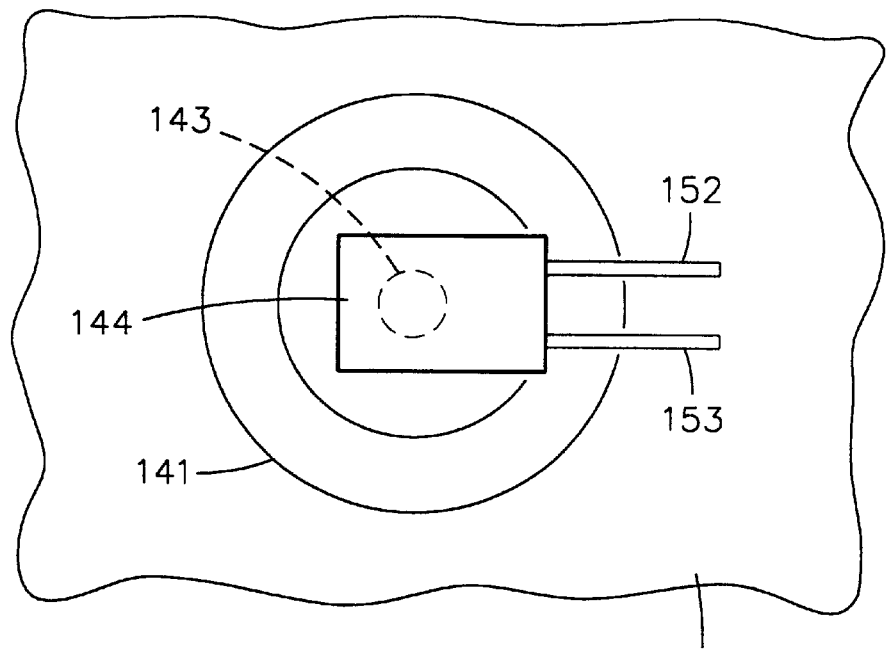
FIG. 15 is a top view of another embodiment of the invention.
Figure 16:
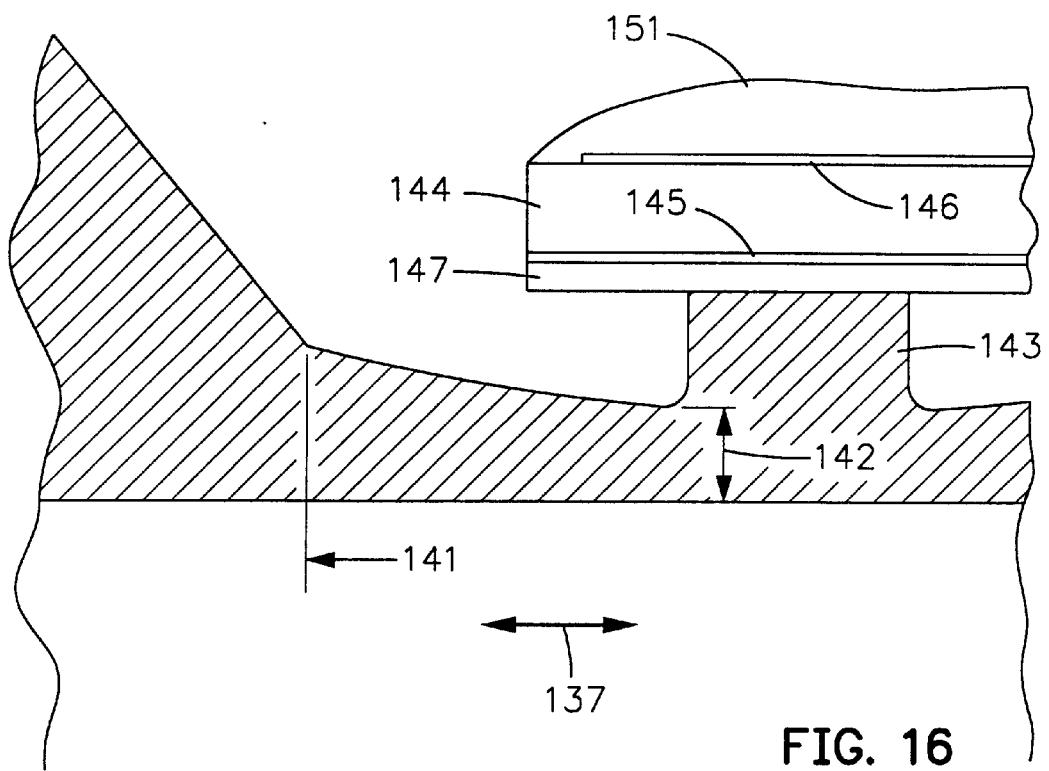
FIG. 16 is an enlarged sectional view of the structure of FIG. 15.

FIGS. 14–16 show another embodiment of the invention. A primary focus of this embodiment is to improve the efficiency of heat transfer to the media in the conduit over minimum area. This is another way to reduce undesired heat flow (wasted heat) from the RTD, and to make the coupling between the RTD element to the media being measured as nearly direct as possible.

In this embodiment, as before, fluid/media flows through conduit 135, which conduit is defined by wall 136, as indicated by arrow 137. The area of wall 136 that is made very thin is referred to as aperture 141. Its circular form can be most clearly seen in FIG. 15. In the middle of the aperture, where the thickness of wall 136 is further reduced, indicated by reference numeral 142 in FIG. 16, is pedestal 143. Chip 144, having the basic characteristics and dimensions of chip 15 shown in FIG. 3, is mounted on pedestal 143. Chip 144 has been modified in this embodiment by a metal plating 145 on the side opposite to the active RTD element 146 (see element 18 in FIG. 3), plus a highly conductive metal layer 147 by which the chip is mounted, metal to metal, on the pedestal. The chip is completed, as before, with a protective seal of fused glass 151 over the RTD sensor element, and leads 152, 153. If desired, the entire structure of FIG. 16 may be potted by foam insulation 154, as shown in FIG. 14 but not in FIG. 15, The area filled with insulation 154 may be evacuated, if desired, prior to applying insulation.

By means of this structure, loss of heat from chip 144 laterally is extremely low because, except for the contact with pedestal 143, the chip is surrounded by air or a foam insulation or equivalent.

Metalizing the base of chip 144 for metal-to-metal contact with pedestal 143 improves thermal transfer from the RTD to the media in the conduit. Metal layer 147 may be pure silver and is preferably in the range of about 0.0025 inch (0.0635 mm) thick. Metal plating or metalization 145 on the surface of chip 144 is extremely thin and merely serves to provide a surface to which layer 147 can readily bond. Further, a metal-bond is likely to be stronger and more durable with time than a polymer or other bonding agent might be.

It can readily be appreciated how heat flow is focused and undesired heat waste is minimized by the shape of the aperture and the pedestal. The thickness 142 of wall 136 is contemplated to be about 0.0025 inch (0.0635 mm), tapering up to about 0.008 inch (0.203 mm) at the thickest edge of aperture 141. The diameter of the pedestal itself is sufficient to securely mount the chip, and is contemplated to be about 0.0125 inch (0.318 mm) in diameter. Its height is sufficient so that chip 144 will clear aperture 141 when it is mounted on the pedestal, preferable about 0.008 inch (0.203 mm).

Because wall portion 142 is so thin it acts as a resistance area to heat flow so that heat more readily transfers to the media through the pedestal and not laterally along the conduit wall.

To further explore the dynamics of the FIGS. 14–16 structure, it can be helpful to examine that heat flow equations involved. With respect to this embodiment:

$$Q = h_c A \Delta T \times C \quad \text{(Eq.1)}$$

Where: Q=power in watts;
$h_c$ =unit thermal coefficient of heat transfer in watts/in$^2$°F.;
A=the effective wetted surface area of the pedestal;
ΔT=the temperature differential between the active and reference sensors; and
C=a conversion constant.

If Eq. 1 is rearranged and the constant, C, is ignored, we have:

$$\frac{Q}{A} = h_c \Delta T \quad \text{(Eq. 2)}$$

The heat flux is defined by the Q/A term and increases with reduction in A, which is the area within conduit 135 that corresponds to the heat transfer area from pedestal 143. Thus the reason for reducing the size of pedestal 143. Radial heat transfer through the adjacent meter still can occur but it is minimized by reduced thickness area 142.

In apparatus this small and with the need to maintain the two-wire loop 4 to 20 mA at 24 VDC it is important to conserve power in every way possible. A good starting point is the chip in itself, which holds the RTD element, its small size having been previously defined. Because the RTD is so small, it requires very little power to heat it. The thin wall of the aperture, and the size of the aperture and pedestal, which are made possible by the size of the chip, enables rapid response by the RTD element to the heat dissipated by the media while minimizing the route and the time for escape of heat radially.

The $h_c$ term is a function of the flowing media mass flow rate per unit duct area, together with the physical properties of the media. For example, water cools much better than air. For any particular design, Q and A are both fixed. Thus, the left side of the equation is constant and, when hc (the mass flow rate per unit of duct area for a particular fluid) increases, the ΔT reduces.

An instrument employing the sensor of this invention can be calibrated for the particular use to which it will be put, including the duct size and the parameters of the media to be involved. From known A, Q, duct size and media, the output of a thermal mass flow rate sensor is a signal representing ΔT, from which mass flow rate is determined.

Figure 17:
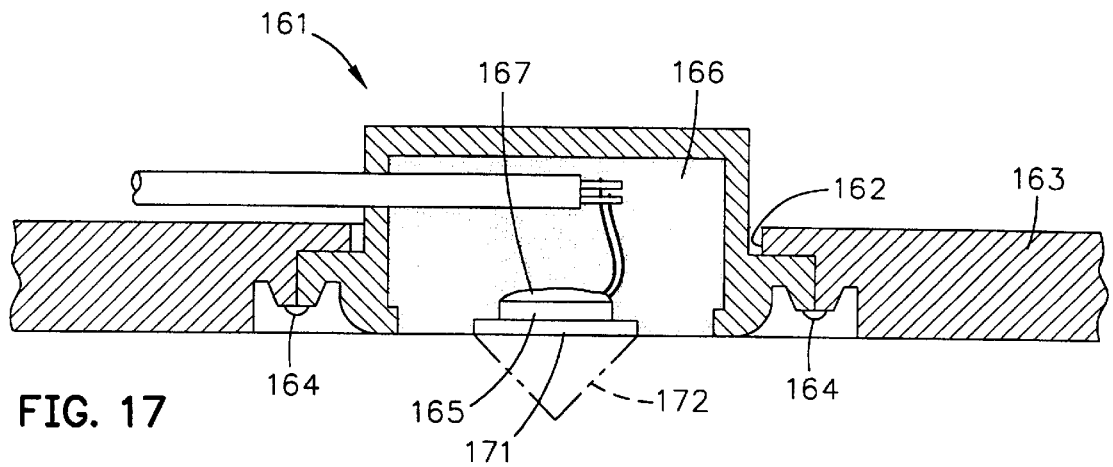
FIG. 17 is a cross sectional view of a still further embodiment of the invention.

Another alternative embodiment is shown in FIG. 17, where modular enclosure 161 is secured to an opening 162 in conduit wall 163. Enclosure 161 is essentially a circular plug which is secured in opening 162 by such means as welds 164. Chip 165 is fixed to the enclosure by being embedded in appropriate potting material 166 such as ceramic, glass, or porcelain, for example. The potting material should be hard, durable, corrosion resistant and impervious to the media to which it will be exposed, while being thermally non-transmissive. The chip has the usual protective coating 167, which may be fused glass, and a corrosion and erosion resistant, highly thermally conductive protective shoe 171 on the side of the chip which is exposed to the media. This is actually more of an alternative to the FIG. 13 embodiment, where the chip is separated from the media only by a thermally conductive surface.

Note that shoe 171 may be modified in size or shape to increase thermal flux density. As an option, a fin or other projection 172 may be added, which projects into the media beyond the boundary layers, and functions to increase heat transfer between the media and the RTD. Projection 172 may have any desired shape. It need only be a good thermal conductor and it may be more than a single element. This configuration is a very effective way to prevent waste of power resulting from radial conduction of heat through the metal structure of, for example, FIG. 16 embodiment.

Figure 18:
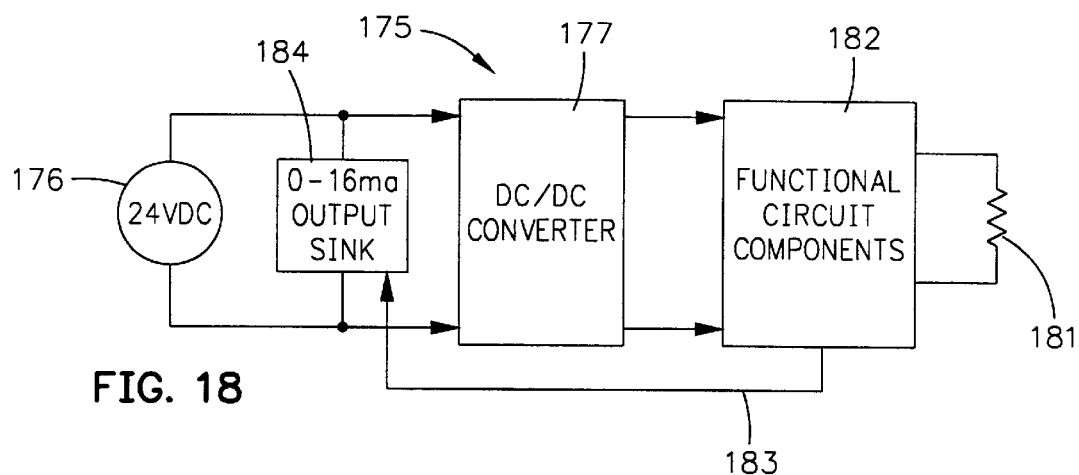
FIG. 18 is a block diagram of a circuit with which the detector chip of the invention may be used.

A circuit which may be advantageously employed with any configuration of the sensor device of this invention is shown in FIG. 18. This is a two-wire loop 175 with 96 milliwatts of input power from 24 VDC, 4–20 mA source 176. Converter 177 changes the input to 8 mA at 10 VDC. Assuming RTD element 181 is at 1600 Ω, it will use, for example, 58 milliwatts at 6 mA with 9.6 volts across it. The functional circuit components 182 may be those in FIG. 4 which process the sensor signals and provide appropriate outputs. The 6 mA through sensor 181 may be configured as in FIG. 17 and is normally sufficient to provide the signals of ΔT required to be used by the other circuit components to provide useful outputs. With 8 mA in circuitry 182 and 6 mA through sensor 181, there are 2 mA in feedback loop 183 to output sink 184, leaving the remaining 40 milliwatts to power the processing and output circuitry. Should an alarm condition occur, for example, excessive flow rate, functional circuit components 182 will generate a signal over line 183 to output sink 184 to sink additional current above the previously discussed 4 mA and thereby alert the remote operator at the 4–20 mA, 24 VDC source. As much as 16 mA could be sink (used) as an alarm signal.

As a practical example, if the resistance of RTD 181 is about 1600 Ω at 300° F. (150° C.), 6 mA through it calculates to 9.6 volts. If, the media temperature drops to 32° F. (0° C.), its resistance will drop to about 1000 Ω, or a change of about 600 Ω. The foregoing assumes the thermal coefficient of the platinum being used as the RTD element is 0.00385 ohms per ohm °C. (0.00385 Ω/Ω°C.).

This is a practical example of an intrinsically safe application of the sensor technology of this invention.

The efficiency and very low power requirements of the sensor of this invention makes it feasible to be used with wireless energization and signal communication. The flow switch of FIGS. 1–18 could be mounted in a remote, inaccessible or hostile location in order to detect the flow rate in the pipeline to which the switch or transmitter is coupled. This makes a wired system difficult.

Power could be sent to the instrument of FIG. 5, which may include any of the embodiments of FIGS. 1–4 and 6–18, by means of beamed microwave frequencies. A receiver such as an antenna (see element 47 in FIG. 5) receives the microwave energy and the instrument converts it to direct current, 24 VDC, 10 ma. The power thus received is employed, for example, by the circuit of FIG. 18. The output signal would be transmitted through the same antenna to a remote receiver. The receiver could be a stationary, mobile, or hand held instrument.

Other types of power and signal handling could be employed. An infrared beam, as well as other electromagnetic means, could supply power to the instrument. Signals could be handled with frequency modulation or other electronic means. The instrument could be amenable to analog or digital signals. A rechargeable battery could be incorporated in the FIG. 5 enclosure. It could provide local power and be recharged remotely. The instrument could be shut off for short periods of time to enable recharging. Another means for providing the power necessary to operate the instrument of this invention could be provided by solar cells. A larger battery, for example, a 12 v battery with 100 amp capacity, could be employed by itself or in conjunction with solar or other power devices. Depending on the conditions in which the instrument exists, any practical power and signal means and combination can be employed.

Figure 19:
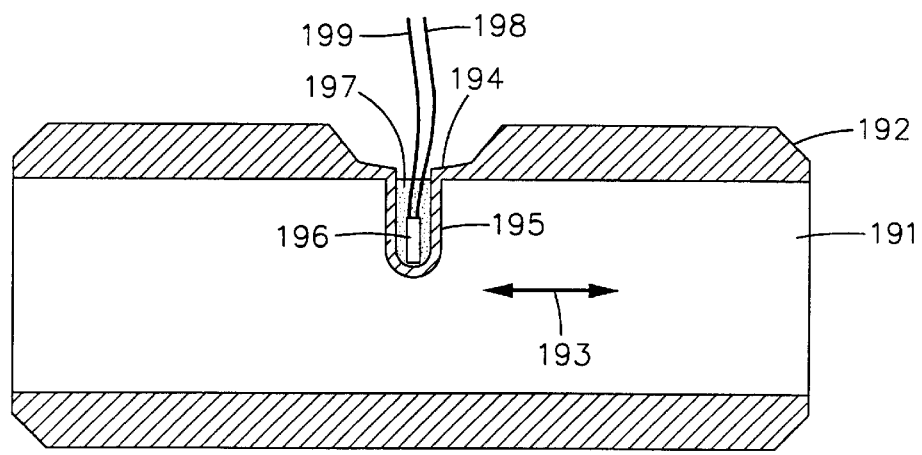
FIG. 19 is a cross-sectional view of a still further embodiment of the invention.

Still another embodiment of the physical structure of the sensor apparatus is shown in FIG. 19. Conduit 191 is defined by wall 192 and the media flows therein as indicated by arrow 193. The basic conduit segment of FIG. 19 may be adapted from the embodiments of FIGS. 1, 6 or 14, for example, where thinned area 194 in wall 192 is drawn inwardly to form insertion device 195. This could be employed as an alternative to the FIG. 7 device, and could be a substantially smaller projection into the media flow. Chip 196 can be formed as before (see FIGS. 3 and 3A) and may be potted in thermally transmissive material 197. It is contemplated that chip 196 will only have edge contact with the inside end of device 195 but the thermal transfer will take place through the walls of device 195 and the intermediate potting material. Chip 196 has leads 198, 199 for power and signal transfer to and from the RTD on one surface of the chip.

The insertion element is also beneficial in that improved thermal isolation between the two sensors is provided. This embodiment has an improved coefficient of heat transfer to the media and is particularly beneficial when wet/dry sensing, or when sensing the interface between non-miscible liquids is the purpose. It employs the combination of the self heated miniature RTD of the other embodiments. It is actually more sensitive to low flow rate when employed as a flow sensor, but it has a somewhat slower response time than the FIG. 1 embodiment. It also incorporates the intrinsically safe feature as previously described.

Examples of the dimensions of the insertion element of this embodiment are that it might be 0.3 inch (7.62 mm) long, 0.093 inch (2.36 mm) across and have a wall thickness of 0.007 inch (0.178 mm). It would operate in the manner as previously described with respect to the other embodiments.

Figure 20:
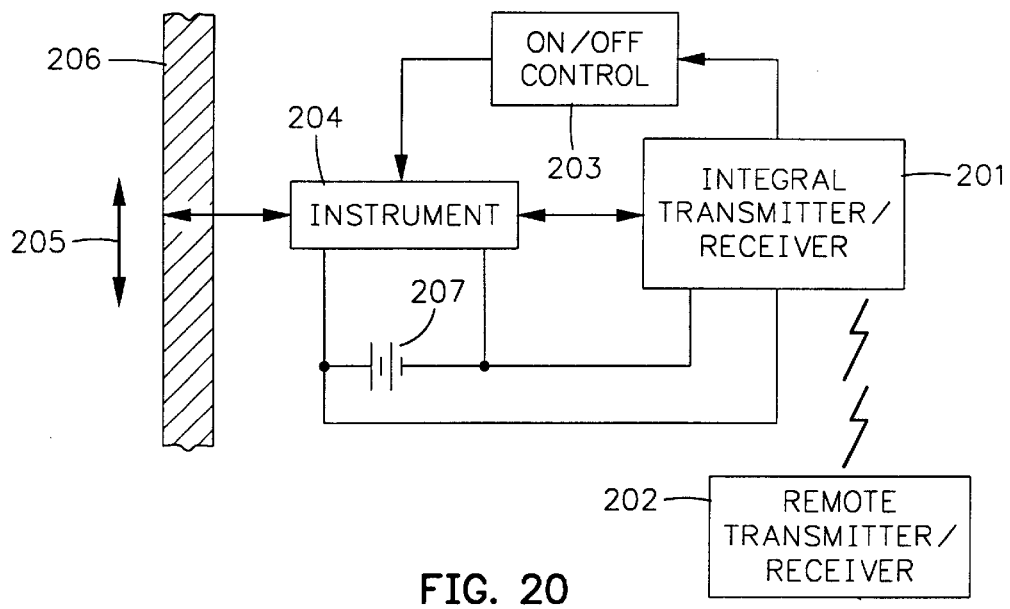
FIG. 20 is a block diagram of an alternative circuit which provides wireless communication to and from the instrument of the invention.

The wireless circuit of FIG. 20 could be used, as an alternative to the FIGS. 4 and 18 circuits, for wireless communication with the instrument of the invention.

Transceiver 201 would normally be held in a low power receiver mode. The operator of remote transceiver 202 would signal element 201 to turn on the transmit mode and ON/OFF control 203 to energize instrument 204 to sense the condition of media 205 in conduit or container 206. Because of the low power consumption of instrument 204 and its fast response time, the system would need to be "ON" for only two or three seconds, drawing only a few milliamperes of current, in order to take readings and transmit useful signals.

Depending on the frequency of system interrogation, a conventional 12-volt automotive battery 207 could power the system for several years. If it were combined with a solar cell it is likely that the battery would, for all practical purposes, never need recharging or replacement. The end user would realize great cost savings and be utilizing currently desirable wireless techniques.

The invention primarily concerns an unheated, or reference, sensor employed in conjunction with an active, or heated, sensor. It is possible that the reference sensor could also be heated if desired for some particular purposes. A temperature differential would also be established, even if both sensors are heated to some varying degree.

In the discussion of prior art mechanical devices, especially magnetic switches, it was noted that they have a wide hysteresis. Hysteresis does not affect the performance of the thermal switch of this invention and, in the context of the present invention, it would be an undesirable feature.

One of the very important aspects of this invention is that this flow sensing apparatus is not pressure sensitive. That is, it is a true mass flow rate sensor at normal temperatures. Additional compensation for temperature variation effects can easily be added and is commonly done in the type of systems related to this invention.

In view of the above discussion it is likely that modifications and improvements will occur to those skilled in this technical field which are within the scope of the invention. Accordingly, the invention is to be limited only by the spirit and scope of the accompanying claims and equivalents thereto.

What is claimed is:

1. A thermal dispersion flow sensing apparatus comprising:
   a fluid flow conduit having a wall defining the fluid flow path and having at least one detent in said wall adapted to receive a detector element;
   a detector comprising a temperature sensitive element on an electrically insulative, thermally conductive substrate, said detector being mounted in said detent of said conduit so as to be in thermal communication with the fluid in the conduit; and
   electrical conductors connected to said temperature sensitive element and adapted to be connected to external signal processing circuitry.

2. The apparatus recited in claim 1, and further comprising a thermally conductive element between said detector and the fluid in the conduit.

3. The apparatus recited in claim 1, wherein said detent of said conduit is shaped and configured to reduce lateral heat dissipation and confine heat transfer from said detector to the fluid in the conduit.

4. The apparatus recited in claim 3, wherein said detent is formed with a generally centrally located pedestal on which said detector is mounted.

5. A thermal dispersion apparatus adapted to sense fluid flow past a surface on one side of a wall, the apparatus comprising:
   at least one reduced thickness area in said wall;
   a first detector comprising a first temperature sensitive element for sensing the temperature of a thermally conductive region, said detector being thermally coupled to said reduced thickness area of said wall, said thermally conductive region in said reduced thickness area being shaped and configured to provide an operationally effective thermal transfer between the fluid in contact with said surface and said detector; and
   means for coupling an operationally effectively power source to said thermally conductive region to effect a temperature differential between said fluid and said thermally conductive region;
   wherein said first temperature sensitive element is heated by electrical power of such low intensity as to be intrinsically safe.

6. A thermal dispersion switch/transmitter apparatus for selectively sensing flow, mixing, phase, condition, liquid level, and interface between non-miscible materials in a fluid media, said apparatus comprising;
   a container having a wall for containing the media and having at least one area of reduced thickness in said wall;
   a first detector comprising a first temperature sensitive element for sensing the temperature of a thermally conductive region, said detector being thermally coupled to said reduced thickness area, said thermally conductive region in said reduced thickness area being shaped and configured to provide an operationally effective thermal transfer between the media in said container and said detector; and
   an electrical circuit to which said electrical thermally conductive region is coupled, said circuit providing operationally effective power to effect a temperature differential between said thermally conductive region and said media, said circuit having an indicator providing information as to the state of the media in said container in relation to the temperature of said first temperature sensitive element;
   wherein the electrical power applied to heat said first temperature sensitive element is no more than about 24 VDC with 4–20 mA of current.

7. The apparatus recited in claim 6, wherein the input 24 VDC power is connected by means of a DC/DC converter from relatively high voltage and low current to a lower voltage and higher current to power the temperature sensitive element.

8. A method of constructing a thermal dispersion switch/transmitter, the method comprising:
   forming at least one area of reduced thickness in the wall of a fluid conduit;
   selecting a detector comprising a temperature sensitive element on a thermally conductive substrate;
   mounting the detector on the reduced thickness area of the fluid conduit wall so that said substrate conforms to the contours of said reduced thickness area; and
   heating said temperature sensitive element by electrical power of such low intensity as to be intrinsically safe.

9. A method of constructing a thermal dispersion switch/transmitter, the method comprising:
   forming at least one area of reduced thickness in the wall of a fluid conduit;
   selecting a solid state detector comprising a temperature sensitive element on a thermally conductive base;
   mounting the detector on the reduced thickness area of the fluid conduit wall;
   connecting the detector in an electrical circuit which provides operationally effective power to the detector chip and provides a signal indicative of the fluid flow in the conduit; and
   heating said temperature sensitive element by electrical power of such low intensity as to be intrinsically safe.

10. A thermal dispersion switch/transmitter comprising:
    a hollow probe comprising a thermal well, said probe having a proximal end and a distal end separated by an enclosing side wall, said proximal end being shaped and configured to be mounted in the wall of a fluid container;
    a mounting element secured to and closing said distal end of said probe;
    a first area of reduced thickness arranged generally normal to the longitudinal axis of and inside said probe;
    a first detector comprising a first temperature sensitive element on an electrically insulative thermally conductive base, said first detector being mounted in said reduced thickness area within said probe and adapted to be positioned within the fluid in the container, said reduced thickness area being shaped and configured to provide and operationally effective thermal transfer between the fluid in said container and said detector; and
    means for coupling an operationally effective electrical power source to said first detector to effect a temperature differential between the fluid in the container and said first temperature sensitive element, the electrical power being applied by the power source is of such low intensity as to be intrinsically safe;
    said one end of said probe being shaped and configured to extend into a fluid flow conduit so that said surface directly contacts the fluid therein and locally generates a flow condition at said temperature sensitive element.

11. A thermal dispersion apparatus adapted to sense fluid flow past a surface on one side of a wall, the apparatus comprising:

at least one reduced thickness area in said wall, a first detector comprising a first temperature sensitive element on an electrically insulative, thermally conductive base, said detector being thermally coupled to said reduced thickness area of said wall, said reduced thickness area being shaped and configured to provide an operationally effective thermal transfer between the fluid in contact with said surface and said detector;

means for sensing the temperature of said first temperature sensitive element;

means for heating said first temperature sensitive element;

means for providing input power and control signals to said heating means by electrical power of such low intensity as to be intrinsically safe; and means for transmitting output signals from said temperature sensing means.

* * * * *